(12) United States Patent
Yeon et al.

(10) Patent No.: US 11,693,605 B2
(45) Date of Patent: *Jul. 4, 2023

(54) STORAGE DEVICE INCLUDING NONVOLATILE MEMORY DEVICE AND CONTROLLER, CONTROLLER AND OPERATING METHOD OF NONVOLATILE MEMORY DEVICE

(71) Applicant: Samsung Electronics Co., Ltd., Suwon-si (KR)

(72) Inventors: Jesuk Yeon, Hwaseong-si (KR); Seontaek Kim, Suwon-si (KR); Young-Ho Park, Anyang-si (KR); Eun Ju Choi, Daejeon (KR); Yonghwa Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/307,309

(22) Filed: May 4, 2021

(65) Prior Publication Data

US 2021/0255810 A1    Aug. 19, 2021

Related U.S. Application Data

(63) Continuation of application No. 15/970,237, filed on May 3, 2018, now Pat. No. 11,029,893.

(30) Foreign Application Priority Data

Sep. 8, 2017    (KR) .................. 10-2017-0115347

(51) Int. Cl.
*G06F 3/06*    (2006.01)
*G06F 12/10*    (2016.01)
(Continued)

(52) U.S. Cl.
CPC ............ *G06F 3/0679* (2013.01); *G06F 3/061* (2013.01); *G06F 3/064* (2013.01); *G06F 3/0611* (2013.01);
(Continued)

(58) Field of Classification Search
CPC ...... G06F 3/0679; G06F 3/061; G06F 3/0611; G06F 3/064; G06F 3/0659; G06F 3/0688;
(Continued)

(56) References Cited

U.S. PATENT DOCUMENTS 7,679,133 B2    3/2010 Son et al.
7,801,877 B1*   9/2010 Depelteau ......... G06F 16/90339
                                                          707/706
(Continued)

FOREIGN PATENT DOCUMENTS

CN    105117283 A    12/2015
CN    106293506 A    1/2017
(Continued)

*Primary Examiner* — Nanci N Wong
(74) *Attorney, Agent, or Firm* — Harness, Dickey & Pierce, P.L.C.

(57) ABSTRACT

A storage device includes a nonvolatile memory device; and a controller configured to, sequentially receive first read commands and a first write command, the first write command being associated with first write data, slice the first write command to generate a plurality of sub-commands, slice the first write data to generate a plurality of sub-data elements, and alternately transmit, to the nonvolatile memory device, at least one read command of the first read commands, and one sub-command of the plurality of sub-commands and one sub-data element of the plurality of sub-data elements.

21 Claims, 19 Drawing Sheets

(51) Int. Cl.
*G06F 12/0802* (2016.01)
*G06F 3/16* (2006.01)
*G11C 16/04* (2006.01)
*G11C 7/10* (2006.01)
*G11C 16/14* (2006.01)
*H10B 43/20* (2023.01)
*G11C 16/26* (2006.01)
*G11C 16/10* (2006.01)

(52) U.S. Cl.
CPC .......... *G06F 3/0629* (2013.01); *G06F 3/0659* (2013.01); *G06F 3/0688* (2013.01); *G06F 3/167* (2013.01); *G06F 12/0802* (2013.01); *G06F 12/10* (2013.01); *G11C 7/1015* (2013.01); *G11C 7/1084* (2013.01); *G11C 16/04* (2013.01); *G11C 16/14* (2013.01); *H10B 43/20* (2023.02); *G11C 16/0483* (2013.01); *G11C 16/10* (2013.01); *G11C 16/26* (2013.01)

(58) Field of Classification Search
CPC ...... G06F 3/167; G06F 12/0802; G06F 12/10; G11C 7/1015; G11C 7/1084; G11C 16/04; G11C 16/14; G11C 16/0483; G11C 16/10; G11C 16/26
See application file for complete search history.

(56) References Cited

U.S. PATENT DOCUMENTS

| | | |
|---|---|---|
| 7,895,398 B2 | 2/2011 | Shet et al. |
| 8,553,466 B2 | 10/2013 | Han et al. |
| 8,559,235 B2 | 10/2013 | Yoon et al. |
| 8,572,325 B2 | 10/2013 | Balakrishnan et al. |
| 8,601,221 B2 | 12/2013 | Chirca et al. |
| 8,654,587 B2 | 2/2014 | Yoon et al. |
| 9,239,788 B2 | 1/2016 | Dong et al. |
| 9,411,727 B2 | 8/2016 | Dong et al. |
| 9,558,112 B1 | 1/2017 | Borchers |
| 9,880,749 B2 | 1/2018 | Yamaguchi et al. |
| 2004/0019708 A1 | 1/2004 | Bissessur et al. |
| 2008/0222330 A1 | 9/2008 | Shima |
| 2010/0312984 A1 | 12/2010 | Robin et al. |
| 2011/0078277 A1 | 3/2011 | Baptist |
| 2011/0233648 A1 | 9/2011 | Seol et al. |
| 2012/0221767 A1 | 8/2012 | Post et al. |
| 2013/0262762 A1* | 10/2013 | Igashira ............... G06F 3/0656 711/114 |
| 2014/0244866 A1 | 8/2014 | Manula et al. |
| 2014/0281188 A1* | 9/2014 | Kwon ................. G06F 12/1009 711/104 |
| 2015/0121006 A1 | 4/2015 | Dong et al. |
| 2016/0179404 A1* | 6/2016 | Nanduri ............... G06F 3/0613 711/103 |
| 2016/0224253 A1* | 8/2016 | Tuers .................... G06F 3/0688 |
| 2016/0224255 A1 | 8/2016 | Park et al. |
| 2016/0357462 A1 | 12/2016 | Nam et al. |
| 2016/0378357 A1 | 12/2016 | Aoki et al. |
| 2017/0123908 A1 | 5/2017 | Resch |
| 2018/0232178 A1 | 8/2018 | Iwaki et al. |
| 2018/0232311 A1* | 8/2018 | Bhati .................. G06F 12/0897 |
| 2018/0267744 A1* | 9/2018 | Miomo ................. G06F 1/3275 |

FOREIGN PATENT DOCUMENTS

| | | |
|---|---|---|
| JP | 3846543 B2 | 11/2006 |
| JP | 2014/186600 A | 10/2014 |
| JP | 2015/099430 A | 5/2015 |
| KR | 10-0177989 B1 | 5/1999 |
| KR | 2014/0094186 A | 7/2014 |

* cited by examiner

STORAGE DEVICE INCLUDING NONVOLATILE MEMORY DEVICE AND CONTROLLER, CONTROLLER AND OPERATING METHOD OF NONVOLATILE MEMORY DEVICE

CROSS-REFERENCE TO RELATED APPLICATIONS

This is a continuation of U.S. application Ser. No. 15/970,237, filed May 3, 2018, which claims priority to Korean Application No. 10-2017-0115347 filed on Sep. 8, 2017, the disclosures of each of which are hereby incorporated by reference in their entirety.

BACKGROUND

1. Field

At least some example embodiments of the inventive concepts relate to a semiconductor circuit, and more particularly, to a storage device including a nonvolatile memory device and a controller; a controller; and an operating method of the nonvolatile memory device.

2. Related Art

As semiconductor manufacturing technologies develop, the storage capacity, performance, and stability of a nonvolatile memory device are improved and manufacturing costs decrease. The field in which a storage device including the nonvolatile memory device is used widens depending on the trend. As the field of the storage device widens, an issue such as performance limit of the storage device due to a distinctive environment of a new use field is occurring.

For example, in a specific field, the storage device may experience frequent read commands and a high-capacity write command. A typical storage device processes read commands and write commands depending on the order received. In this case, read commands following the high-capacity write command experience a longer delay time than read commands that do not follow a high-capacity write command. Accordingly, it may be advantageous to prevent a delay caused by a write command.

SUMMARY

According to at least some example embodiments, a storage device includes a nonvolatile memory device; and a controller configured to sequentially receive first read commands and a first write command, the first write command being associated with first write data, slice the first write command to generate a plurality of sub-commands, slice the first write data to generate a plurality of sub-data elements, and alternately transmit, to the nonvolatile memory device, at least one read command of the first read commands, and one sub-command of the plurality of sub-commands and one sub-data element of the plurality of sub-data elements.

According to at least some example embodiments, a controller includes memory storing a first queue, a second queue, and computer-executable instructions; and a processor configured to execute the computer-executable instructions such the processor is configured to store, in the first queue, commands received from an external device, slice a write command from the first queue to generate sub-commands, store the sub-commands in the second queue, select one of the first queue and the second queue, and transmit a command from the selected queue to an external nonvolatile memory device.

According to at least some example embodiments, an operating method of a storage device which includes a nonvolatile memory device and a controller include sequentially receiving, at the controller, read commands and a write command from an external device, the write command being associated with write data; slicing, at the controller, the write command to generate sub-commands; slicing, at the controller, the write data to generate sub-data elements; and transmitting, from the controller to the nonvolatile memory device, at least one read command of the read commands, and one sub-command of the sub-commands and one sub-data element of the sub-data elements.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Figure 1:
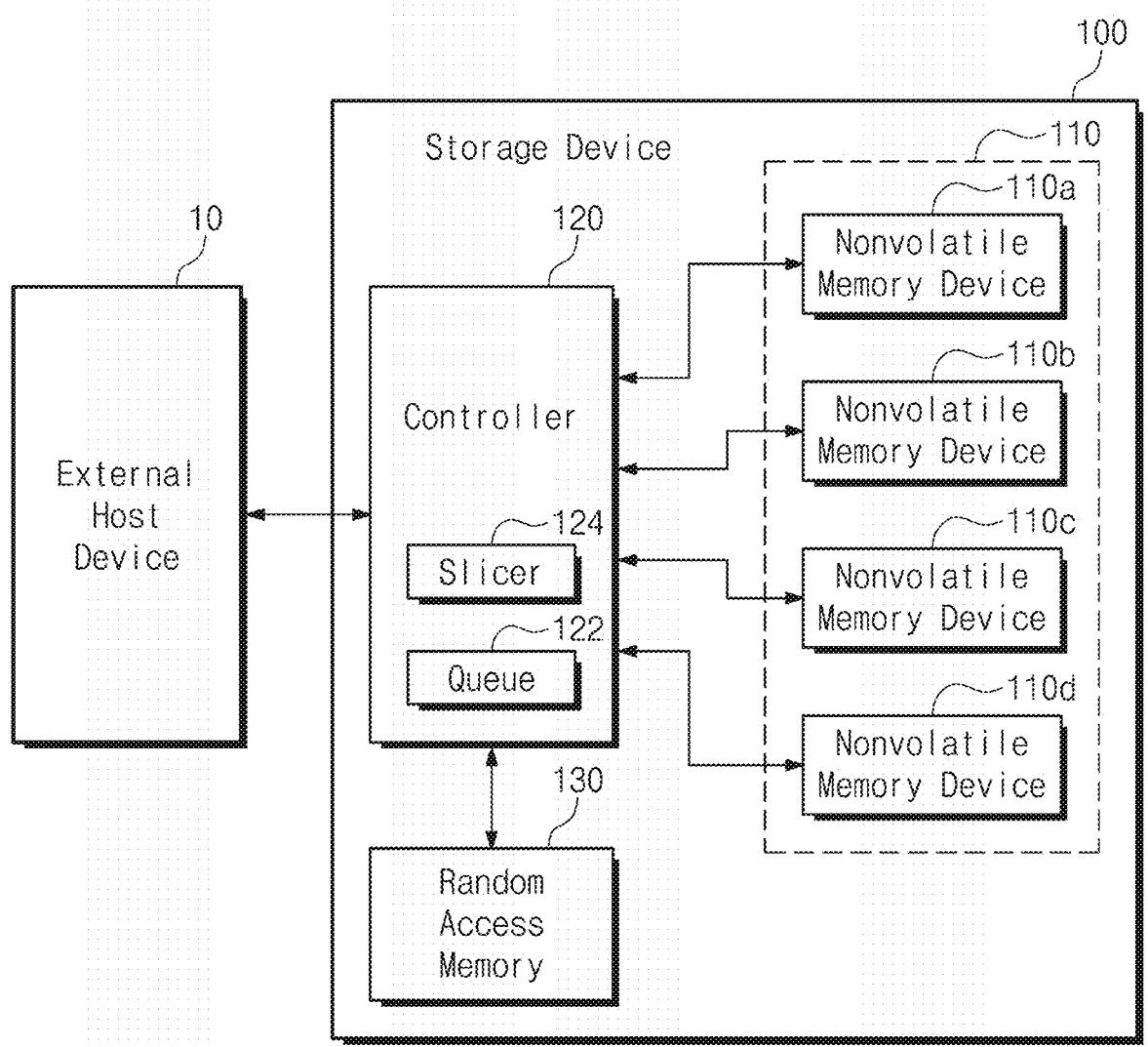
FIG. 1 is a block diagram illustrating a storage device according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a storage device 100 according to at least one example embodiment of the inventive concepts. Referring to FIG. 1, the storage device 100 includes a nonvolatile memory 110, a controller 120, and a random access memory 130. The nonvolatile memory 110 may include a plurality of nonvolatile memory devices 110a to 110d. The nonvolatile memory devices 110a to 110d may communicate with the controller 120 through independent channels.

Each of the nonvolatile memory devices 110a to 110d may include a flash memory. However, the nonvolatile memory devices 110a to 110d are not limited as including the flash memory. For example, the nonvolatile memory devices 110a to 110d may include at least one of various nonvolatile memory devices, such as a phase-change RAM (PRAM), a magnetic RAM (MRAM), a resistive RAM (RRAM), and a ferroelectric RAM (FeRAM).

The four nonvolatile memory devices 110a to 110d are illustrated in FIG. 1 as communicating with the controller 120 through independent channels. However, the number of nonvolatile memory devices communicating with the controller 120 through independent channels is not limited. One nonvolatile memory device (e.g., 110a) is illustrated in FIG. 1 as communicating with the controller 120 through one channel. However, the number of nonvolatile memory devices communicating with the controller 120 through one channel is not limited. For example, according to at least some example embodiments, more than one nonvolatile memory device (e.g., two memory devices) per channel may communicate with the controller 120.

The controller 120 may communicate with an external host device 10. The controller 120 may receive various commands including a write command, a read command, an erase command, etc. from the external host device 10. The controller 120 may process various commands received from the external host device 10, by using the random access memory 130 or the nonvolatile memory devices 110a to 110d.

The controller 120 may use the random access memory 130 as a buffer memory. For example, data transmitted from the external host device 10 to the nonvolatile memory devices 110a to 110d (i.e., data to be written) may be temporarily stored in the random access memory 130. Also, data transmitted from the nonvolatile memory devices 110a to 110d to the external host device 10 (i.e., read data) may be temporarily stored in the random access memory 130.

The controller 120 may use the random access memory 130 as a working memory. Metadata needed to manage the storage device 100 or the nonvolatile memory devices 110a to 110d or a part of the metadata may be loaded on the random access memory 130. The controller 120 may manage the storage device 100 or the nonvolatile memory devices 110a to 110d by using the metadata loaded on the random access memory 130.

The controller 120 is configured to control a write, read, or erase operation of the nonvolatile memory devices 110a to 110d. The controller 120 may transmit various commands to the nonvolatile memory devices 110a to 110d such that the nonvolatile memory devices 110a to 110d perform the write, read, or erase operation. For distinction from other commands, below, commands transmitted from the controller 120 to the nonvolatile memory devices 110a to 110d are called "device commands" or "device access commands."

The controller 120 includes a command queue 122 and a slicer 124. The command queue 122 may store commands received from the external host device 10. For example, the controller 120 may enqueue commands received from the external host device 10 in the command queue 122. In an embodiment, commands registered in the command queue 122 may be processed based on a first-in, first-out (FIFO) method, and exceptional scheduling may be allowed.

The controller 120 may sequentially fetch and process commands stored in the command queue 122. If a command fetched from the command queue 122 is a write command, the slicer 124 may slice the write command and write data associated with the write command to generate sub-commands and sub-data elements. The controller 120 may transmit read commands and the sub-commands (together with the sub-data elements) to the nonvolatile memory devices 110a to 110d.

Figure 2:
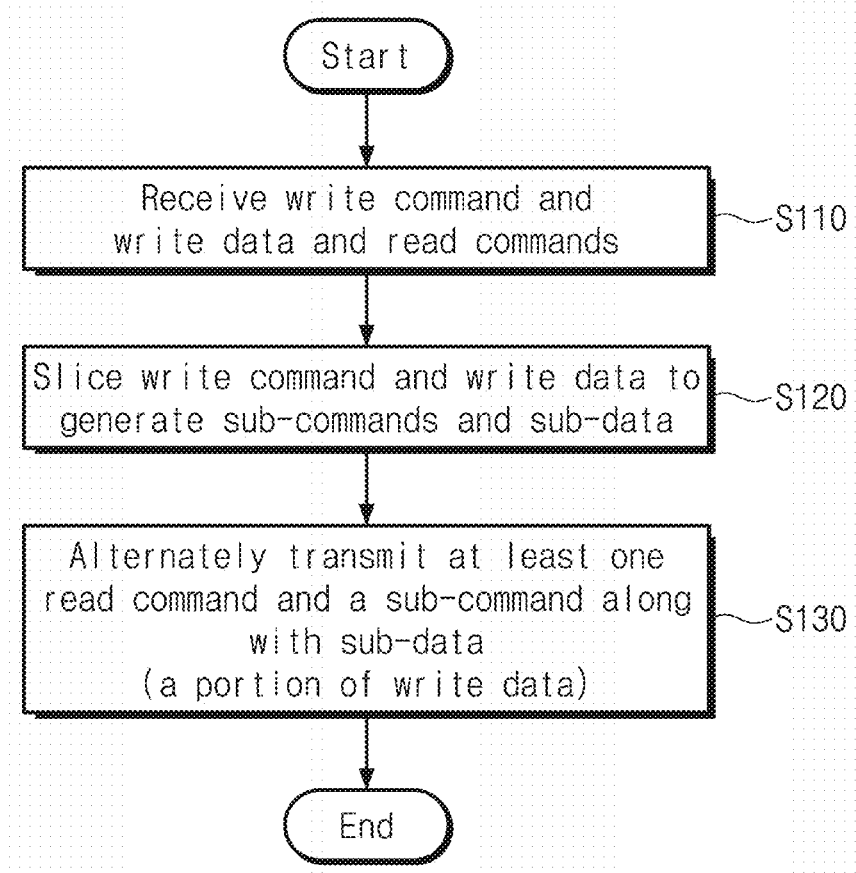
FIG. 2 is a flowchart illustrating an operating method of the storage device according to at least one example embodiment of the inventive concepts.

FIG. 2 is a flowchart illustrating an operating method of the storage device 100 according to at least one example embodiment of the inventive concepts. Referring to FIGS. 1 and 2, in operation S110, the controller 120 may receive a write command and write data, and read commands from the external host device 10.

The write command and the read commands may be sequentially received. For example, the read commands may be received after the write command is received. The write command and the read commands may be stored in the command queue 122, and the write data may be stored in the random access memory 130.

In operation S120, the slicer 124 may slice the write command and the write data to generate sub-commands and sub-data elements. For example, if the write command is fetched from the command queue 122, the slicer 124 may slice the write command to generate the sub-commands. When the write command is sliced, an address range of the write data associated with the write command is also sliced to be allocated to the sub-commands.

In operation S130, the controller 120 may alternately transmit at least one read command and one sub command to the nonvolatile memory devices 110a to 110d. A sub command may be transmitted together with a sub-data element (i.e., a part of the write data) associated with the sub command. That is, the write command may be sequentially processed in units of sub command, and a read command may be processed while the write command is processed in phases.

Even though the priority of read commands is the same as the priority of a write command, the controller 120 may alternately transmit at least one read command and a sub command. Accordingly, processing of a read command is prevented from being delayed due to a write command in the storage device 100.

Figure 3:
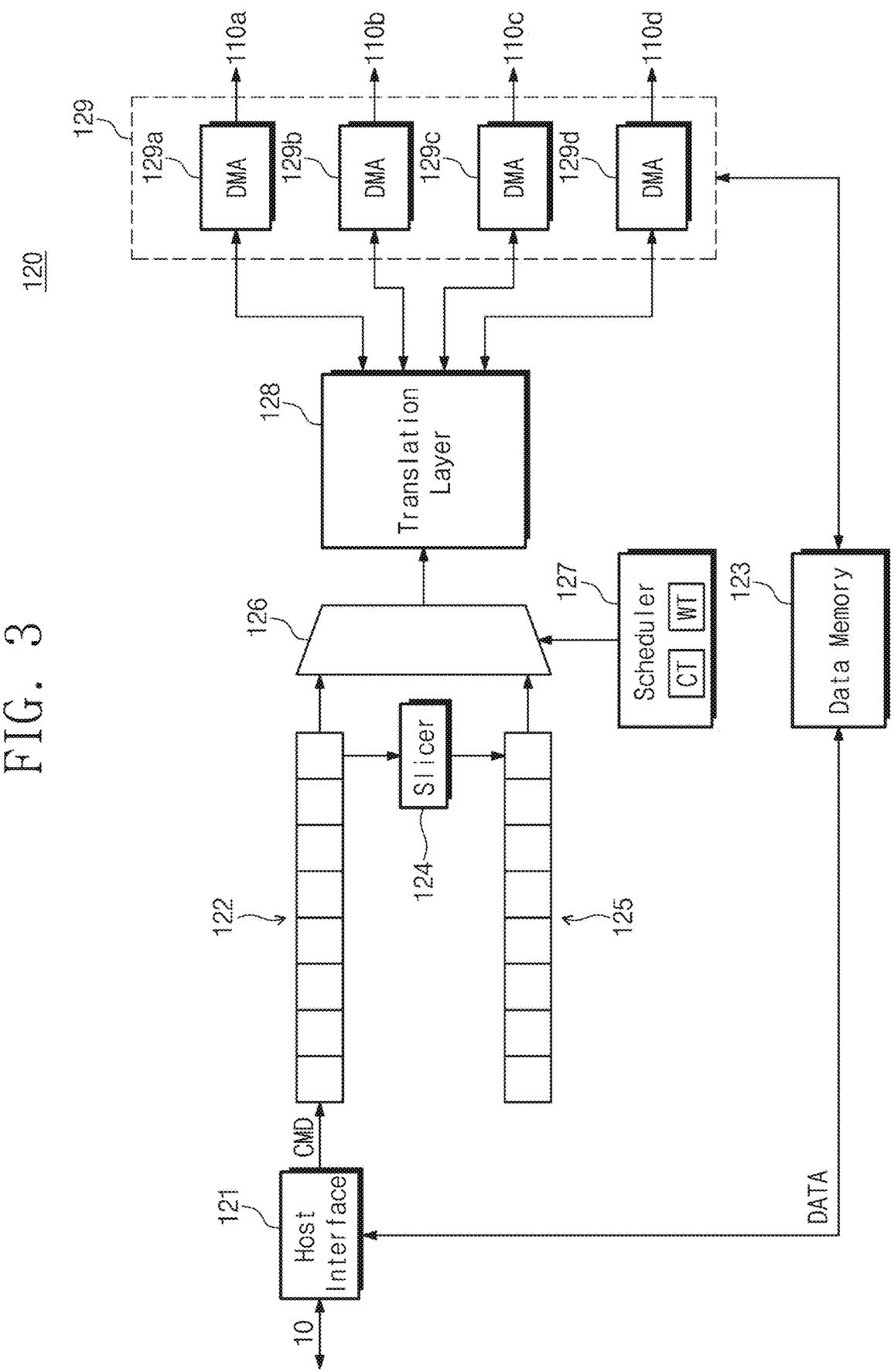
FIG. 3 is a conceptual diagram illustrating an implementation example of a controller according to at least one example embodiment of the inventive concepts.

FIG. 3 is a conceptual diagram illustrating an implementation example of the controller 120 according to at least one example embodiment of the inventive concepts. Referring to FIGS. 1 and 3, the controller 120 includes a host interface 121, the command queue 122, a data memory 123, the slicer 124, a sub-queue 125, a selector 126, a scheduler 127, a translation layer 128, and a memory access 129.

The host interface 121 may communicate with the external host device 10. The host interface 121 may receive a command CMD from the external host device 10. The host interface 121 may enqueue a read command or a write command in the command queue 122. The host interface 121 may receive data, for example, write data from the external host device 10. The host interface 121 may store the write data in the data memory 123.

The host interface 121 may output data stored in the data memory 123, for example, read data to the external host device 10. In an embodiment, the host interface 121 and the external host device 10 may perform packet-based communication. A block that depacketizes a packet to extract a command CMD and data or a block that packetizes data may be provided or added in the host interface 121 or between the host interface 121, and the command queue 122 and the data memory 123.

The command queue 122 may store the command CMD received from the host interface 121. The command queue 122 may include entities. Each entity may store one command. If priorities of commands stored in the command queue 122 are the same, the commands stored in the command queue 122 may be fetched according to the first-in, first-out (FIFO) scheduling scheme.

The data memory 123 may store data transmitted from the external host device 10, for example, write data. The write data may be transmitted to the nonvolatile memory devices 110a to 110d by the memory access 129. The data memory 123 may store data transmitted from the nonvolatile memory devices 110a to 110d, for example, read data. The read data may be transmitted to the external host device 10 through the host interface 121.

The slicer 124 may fetch a write command among commands fetched from the command queue 122. The slicer 124 may slice a write command to generate sub-commands. The slicer 124 may enqueue the sub-commands in the sub-queue 125. The sub-queue 125 may include entities. Each entity may store one sub command. If priorities of sub-commands stored in the sub-queue 125 are the same, the sub-commands stored in the sub-queue 125 may be fetched according to the first-in, first-out (FIFO) scheduling scheme.

The selector 126 may select one of the command queue 122 and the sub-queue 125 under control of the scheduler 127. A command (a read command or a sub command) may be fetched from the queue (the command queue 122 or the sub-queue 125) selected by the selector 126. The fetched command is transmitted to the translation layer 128.

The scheduler 127 may control the number of times that the selector 126 selects the command queue 122 and the sub-queue 125. For example, the selector 126 may select one of the command queue 122 and the sub-queue 125 based on a first weight corresponding to the command queue 122 and a second weight corresponding to the sub-queue 125. The scheduler 127 may set, change, or initialize the first and second weights.

The scheduler 127 may include a counter CT and a write threshold WT. The counter is configured to generate a count value that can be incremented or reset. The count value may also be referred to as a count. The counter CT and the write threshold WT may be used for the scheduler 127 to manage the first weight of the command queue 122 and the second weight of the sub-queue 125. The write threshold WT may be any positive integer set by the scheduler 127 or by an external device. The write threshold WT may be stored in an internal volatile or nonvolatile memory of the scheduler 127 or the controller 120.

The scheduler 127 may increase a count of the counter CT upon fetching a read command from the command queue 122. If the count of the counter CT reaches the write threshold WT, the scheduler 127 may fetch one sub command from the sub-queue 125. After fetching the sub command from the sub-queue 125, the scheduler 127 may reset the counter CT. That is, the write threshold WT may indicate a ratio of an access frequency of the command queue 122 to an access frequency of the sub-queue 125 and may be interpreted as the first and second weights.

The translation layer 128 may translate addresses of a command fetched from the command queue 122 or the sub-queue 125 to device addresses of the nonvolatile memory devices 110a to 110d. For example, the addresses of the fetched command may be logical addresses used in the external host device 10. The device addresses may distinguish storage spaces within the nonvolatile memory devices 110a to 110d.

The translation layer 128 performs address translation based on a translation unit. In the case where an address range of the fetched command exceeds the translation unit, the translation layer 128 may slice the address range by the translation unit to generate sliced address ranges. The translation layer 128 may translate the sliced address ranges to device address ranges. The translation layer 128 may transmit the device address ranges to the memory access 129 in connection with the respective device commands. An operation of the translation layer 128 will be more fully described with reference to FIG. 5.

The memory access 129 may include direct memory accesses (DMAs) 129a to 129d corresponding to the nonvolatile memory devices 110a to 110d, respectively. The direct memory accesses 129a to 129d may respectively access the nonvolatile memory devices 110a to 110d depending on device commands transmitted from the translation layer 128.

For example, in response to a write command, the direct memory accesses 129a to 129d may transmit data stored in the data memory 123 to the nonvolatile memory devices 110a to 110d. In response to a read command, the direct memory accesses 129a to 129d may read data from the nonvolatile memory devices 110a to 110d and may store the read data in the data memory 123. The direct memory accesses 129a to 129d may be implemented by well-known direct memory access controllers respectively.

In an embodiment, the command queue 122 or the sub-queue 125 may support priority-based scheduling. If a priority of a new command enqueued in the command queue 122 or the sub-queue 125 is higher than priorities of previously stored commands, the new command may be stored in the entity at the front of existing commands.

For example, a function of performing priority-based scheduling may be provided in the scheduler 127. As another example, an additional scheduler to perform priority-based scheduling may be provided in the controller 120. However, as described above, when priorities of read commands and write commands are the same, the controller 120 according to at least one example embodiment of the inventive concepts may process the read commands while a write command is gradually processed.

In an embodiment, an error correction block (refer to 350 of FIG. 17) to apply an error correction code may be provided in the controller 120. The error correction block may apply an error correction code between the data memory 123 and the memory access 129. A parity to apply an error correction code may be added to data to be transmitted from the data memory 123 to the memory access 129. When data are transmitted from the memory access 129 to the data memory 123, an error may be detected or corrected based on the error correction code or the parity.

In an embodiment, device command queues (not illustrated) may also be added in the memory access 129. Each of the direct memory accesses 129a to 129d may be associated with at least one device command queue. Commands transmitted to the direct memory accesses 129a to 129d may be respectively enqueued in the device command queues. Each of the direct memory accesses 129a to 129d may fetch and process a device command from a device command queue one by one.

Figure 4:
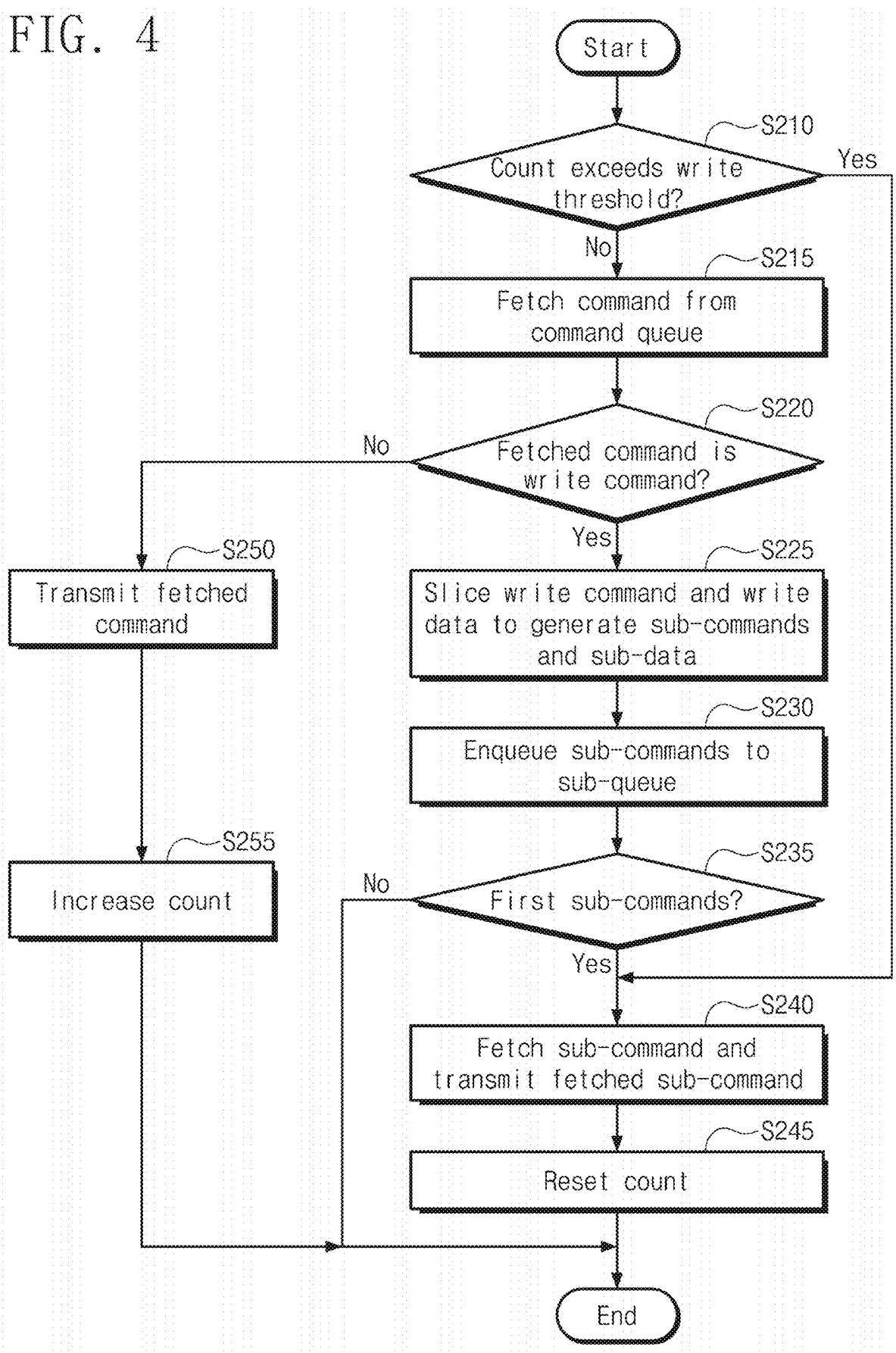
FIG. 4 is a flowchart illustrating a detailed example in which the controller fetches and processes a command.

FIG. 4 is a flowchart illustrating a detailed example in which the controller 120 fetches and processes a command. Referring to FIGS. 3 and 4, in operation S210, the selector 126 determines whether a count of the counter CT reaches the write threshold WT. If the count reaches the threshold value, operation S240 is performed. If the count does not reach the threshold value, operation S215 is performed.

If it is assumed that the count does not reach the write threshold WT, in operation S215, one command is fetched from the command queue 122. In operation S220, the slicer 124 determines whether the fetched command is a write command. If the fetched command is the write command, operation S225 is performed. If the fetched command is not the write command, for example, is a read command, operation S250 is performed.

If it is assumed that the fetched command is the write command, in operation S225, the slicer 124 may slice the write command and write data to generate sub-commands and sub-data elements. In operation S230, the slicer 124 may enqueue the sub-commands in the sub-queue 125.

In operation S235, the selector 126 determines whether the sub-commands enqueued in the sub-queue 125 are the first sub-commands. For example, the first sub-commands mean sub-commands that are enqueued in the sub-queue 125 in which sub-commands are not stored or are first enqueued in the sub-queue 125 being empty. The first sub-commands are not limited as meaning sub-commands enqueued in the sub-queue 125 for the first time.

If the sub-commands are not the first sub-commands, the process ends. If the sub-commands are the first sub-commands, operation S240 is performed. In operation S240, the selector 126 may fetch a sub-command from the sub-queue 125 and may transmit the fetched sub-command to the translation layer 128.

The sub-command may be transmitted to the nonvolatile memory devices 110a to 110d through the memory access 190 together with the sub-data element associated with the sub-command. After the sub-command is fetched, in operation S245, the scheduler 127 may reset the count of the counter CT. Afterwards, the process ends.

Returning to operation S220, if the fetched command is not the write command, operation S250 is performed. In operation S250, the selector 126 may transmit the fetched command to the translation layer 128. In operation S255, the scheduler 127 may increase the count of the counter CT. Afterwards, the process ends.

Returning to operation S210, if the count reaches the write threshold WT, operation S240 is performed. In operation S240, the selector 126 may fetch a sub-command from the sub-queue 125 and may transmit the fetched sub-command to the translation layer 128. After the sub-command is fetched, in operation S245, the scheduler 127 may reset the count of the counter CT. Afterwards, the process ends.

The process illustrated in FIG. 4 shows an example in which one command of the command queue 122 or the sub-queue 125 is processed. After the process of FIG. 4 is performed, if at least one command (or sub-command) is stored in the command queue 122 or the sub-queue 125, the process illustrated in FIG. 4 may be again performed. The process illustrated in FIG. 4 may be repeated until a command is absent from the command queue 122 or the sub-queue 125.

In an embodiment, the scheduler 127 may control the selector 126 such that an empty queue among the command queue 122 and the sub-queue 125 is not selected. For example, when the sub-queue 125 is empty and at least one command is present in the command queue 122, the scheduler 127 may control the selector 126 such that one command is fetched from the command queue 122 regardless of the write threshold WT.

When the command queue 122 is empty and at least one sub-command is present in the sub-queue 125, the scheduler 127 may control the selector 126 such that one sub-command is fetched from the sub-queue 125 regardless of the write threshold WT. When both the command queue 122 and the sub-queue 125 are empty, the scheduler 127 may allow the selector 126 to wait until a new command is enqueued in the command queue 122.

As described above, according to at least one example embodiment of the inventive concepts, one of four procedures may be performed when a command is fetched from the command queue 122. Firstly, if a count reaches the write threshold WT, a sub-command is fetched from the sub-queue 125 and is transmitted to the nonvolatile memory devices 110a to 110d. Afterwards, the count of the counter CT is reset.

Secondly, if the count does not reach the write threshold WT and a command fetched from the command queue 122 is not a write command, a command (e.g., a read command) fetched from the command queue 122 is transmitted to the nonvolatile memory devices 110a to 110d. Afterwards, the count of the counter CT is increased.

Thirdly, if the count does not reach the write threshold WT and a command fetched from the command queue 122 is a write command, sub-commands are generated by slicing the write command. The sub-commands are enqueued in the sub-queue 125. If the sub-commands are not the first commands, the count of the counter CT is maintained without increase.

Fourthly, if the count does not reach the write threshold WT and a command fetched from the command queue 122 is a write command, sub-commands are generated by slicing the write command. The sub-commands are enqueued in the sub-queue 125. If the sub-commands are the first commands, one sub-command is fetched from the sub-queue 125, and the fetched sub-queue is transmitted to the nonvolatile memory devices 110a to 110d. Afterwards, the count of the counter CT is reset.

In an embodiment, the command (or the sub-command) output from the selector 126 may be transmitted to one or more of the nonvolatile memory devices 110a to 110d depending on addresses or an address range. A nonvolatile memory device or nonvolatile memory devices receiving the command (or the sub-command) may operate depending on the command (or the sub-command).

Figure 5:
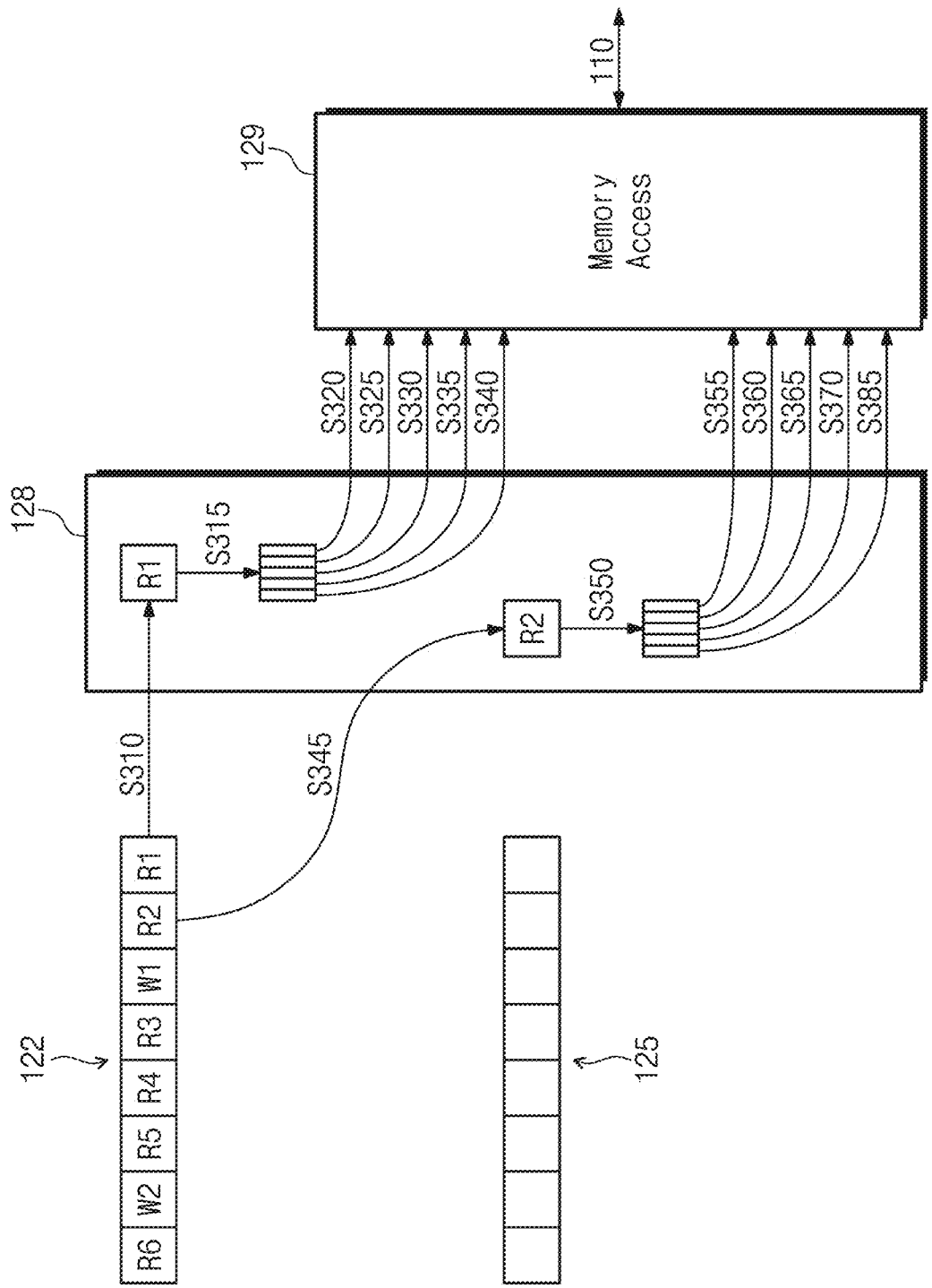
FIG. 5 illustrates an example in which commands are processed in the controller according to at least one example embodiment of the inventive concepts.

FIG. 5 illustrates an example in which commands are processed in the controller 120 according to at least one example embodiment of the inventive concepts. In an embodiment, some components, which are needed to process commands, from among components of the controller 120, are illustrated in FIG. 5, and the remaining components are omitted. Also, for ease of explanation, at least some example embodiments are explained with reference to a scenario in which it is assumed that only read commands and write commands are received. However, according to at least some example embodiments, commands different from the read and write commands may also be enqueued in the command queue 122.

Referring to FIGS. 4 and 5, first and second read commands R1 and R2, a first write command W1, third to fifth read commands R3 to R5, a second write command W2, and a sixth read command R6 may be sequentially enqueued in the command queue 122.

Since the sub-queue 125 is empty, in operation S310, a command may be fetched from the command queue 122. Since the first read command R1 is stored at the head of the command queue 122, the first read command R1 is fetched and is transmitted to the translation layer 128. In operation S315, the translation layer 128 may slice the first read command R1 depending on the translation unit.

For example, if an address range (or addresses) associated with the first read command R1 is five-times the translation unit, the translation layer 128 may slice the address range of the first read command R1 into five address ranges. The sliced address ranges may be associated with device commands (e.g., device read commands), respectively.

In operation S320 to operation S340, the device commands may be respectively transmitted to the nonvolatile memory 110 through the memory access 129. For example, the device commands may be transmitted to the same nonvolatile memory device through the same direct memory access or may be transmitted to different nonvolatile memory devices through different direct memory accesses. In the case where the device commands are output through different direct memory accesses, the device commands may be output in parallel, not sequentially.

In operation S345, a next command is fetched from the command queue 122. For example, the second read command R2 stored next to the first read command R1 may be fetched. In operation S350, the second read command R2 is sliced according to the translation unit. In an embodiment, an address range of the second read command R2 may be sliced into five address ranges. The sliced address ranges may be associated with device commands (e.g., device read commands), respectively.

In operation S355 to operation S385, the device commands may be respectively transmitted to the nonvolatile memory 110 through the memory access 129. In an embodiment, if the translation layer 128 completes translation of the first read command R1, the translation layer 128 may start the translation of the second read command R2 even before the device commands of the first read command R1 are transmitted to the memory access 129 or the nonvolatile memory 110.

Figure 6:
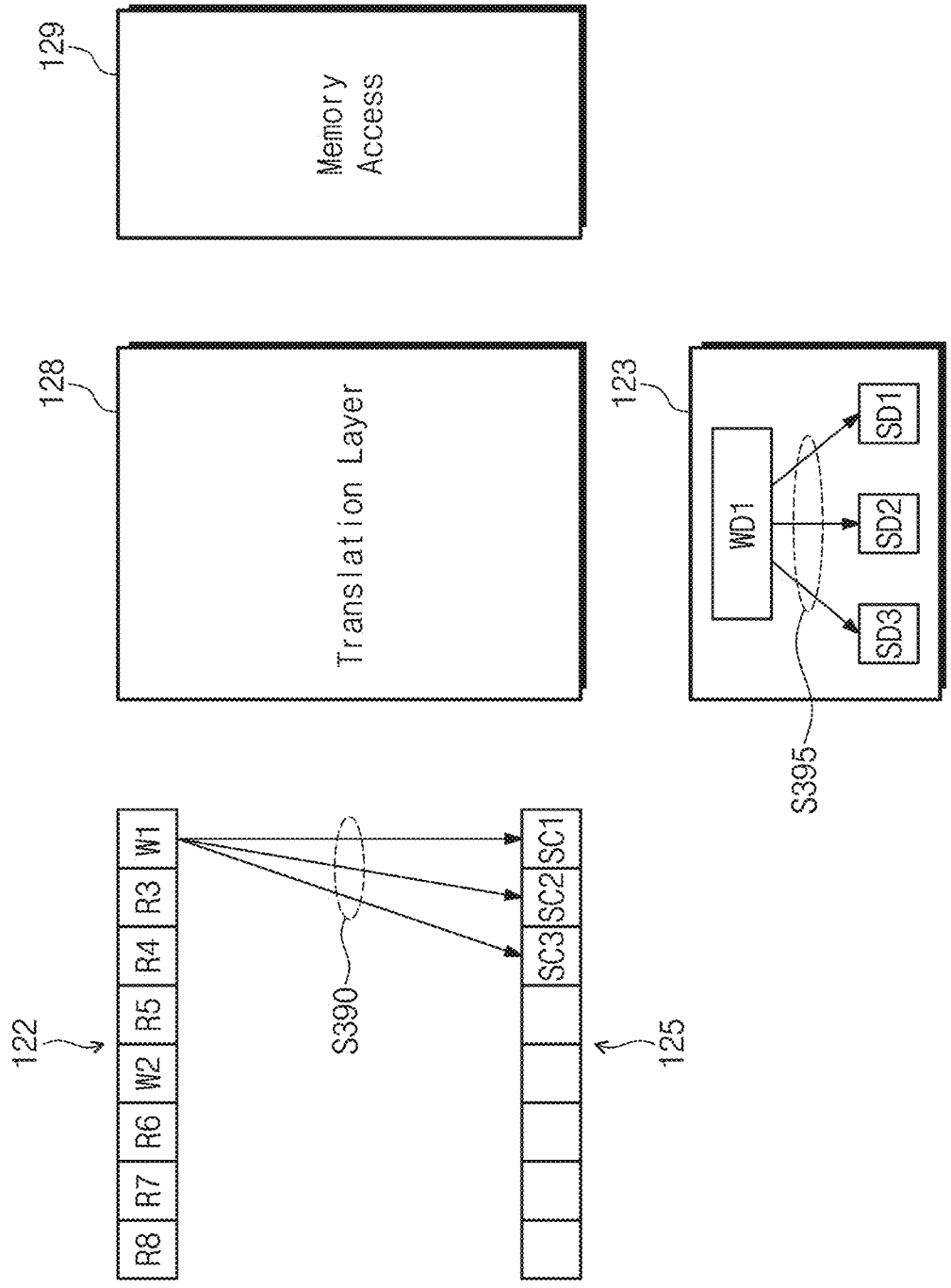
FIG. 6 shows an example in which commands are processed in the controller, after FIG. 5.

FIG. 6 shows an example in which commands are processed in the controller 120, after FIG. 5. Referring to FIGS. 3, 5, and 6, the first write command W1 stored next to the second read command R2 in the command queue 122 may be stored in the foremost entity. Locations of the third to fifth read commands R3 to R5, the second write command W2, and the sixth read command R6 may be shifted according to the first write command W1. Afterwards, seventh and eighth read commands R7 and R8 may be enqueued in the command queue 122.

Since the sub-queue 125 is empty, the first write command W1 is fetched from the command queue 122. An address range associated with the first write command W1, that is, the size of first write data WD1 may be three-times a slice unit defined in advance. Accordingly, in operation S390, the first write command W1 may be sliced into first to third sub-commands SC1 to SC3. The first to third sub-commands SC1 to SC3 may be enqueued in the sub-queue 125.

In operation S395, the first write data WD1 may be sliced into first to third sub-data elements SD1 to SD3 in the data memory 123. For example, according to at least some example embodiments of the inventive concepts, the first write data WD1 may be sliced in the data memory 123 conceptually, not actually. For example, it may be understood that the first write data WD1 are sliced into the first to third sub-data elements SD1 to SD3 as the address range of the first write command W1 is sliced into the address ranges of the first to third sub-commands SC1 to SC3.

For example, the slice unit may be associated with the translation unit of the translation layer 128. The slice unit may be set to an integer multiple of the translation unit of the translation layer 128. As another example, the slice unit may be set to an integer multiple of a write or read unit of a nonvolatile memory device. As another example, the slice unit may be set to an integer multiple of an access unit of a direct memory access.

Figure 7:
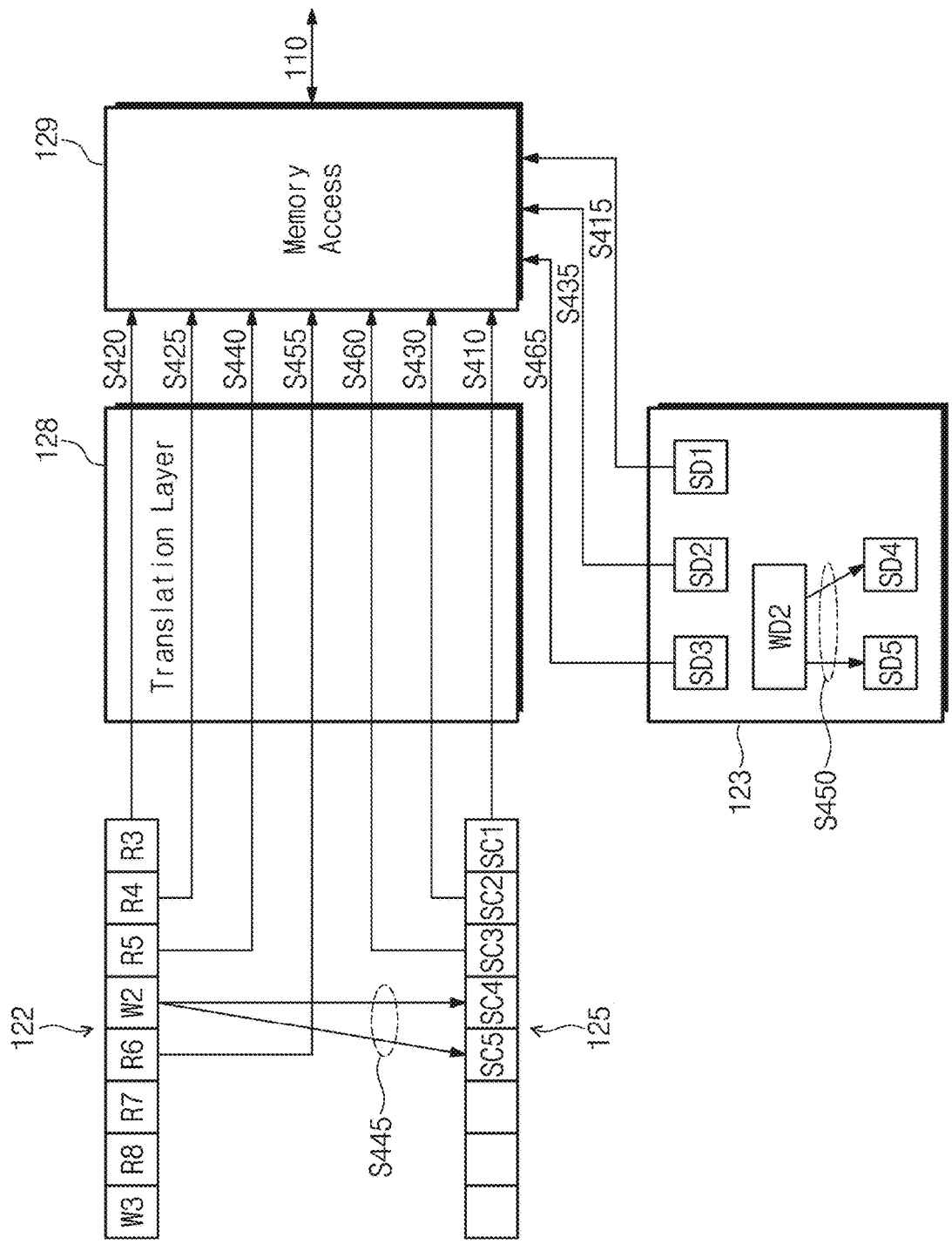
FIG. 7 shows an example in which commands are processed in the controller, after FIG. 6.

FIG. 7 shows an example in which commands are processed in the controller 120, after FIG. 6. Referring to FIGS. 3, 6, and 7, locations of the third to fifth read commands R3 to R5, the second write command W2, and the sixth to eighth read commands R6 to R8 may be shifted in the command queue 122, and a third write command W3 may be enqueued in the command queue 122.

The first to third sub-commands SC1 to SC3 may be the first sub-commands enqueued in a state where the sub-queue 125 is empty. Accordingly, in operation S410, the first sub-command SC1 is fetched from the sub-queue 125. The first sub-command SC1 may be transmitted to the nonvolatile memory 110 through the memory access 129 after being sliced and translated according to the translation unit in the translation layer 128.

In operation S415, the first sub-data element SD1 associated with the first sub-command SC1 may be transmitted from the data memory 123 to the nonvolatile memory 110 through the memory access 129. As the first sub-command SC1 is transmitted, a count of the counter CT may be reset (e.g., to "0")

In an embodiment, it is assumed that the write threshold WT is "2". Since the count (e.g., "0") is under the write threshold WT (e.g., "2"), in operation S420, the third read command R3 is fetched from the command queue 122. The third read command R3 may be transmitted to the nonvolatile memory 110 through the memory access 129 after being sliced and translated according to the translation unit in the translation layer 128. The count of the counter CT may be increased (e.g., to "1").

Since the count (e.g., "1") is under the write threshold WT (e.g., "2"), in operation S425, the fourth read command R4 is fetched from the command queue 122. The fourth read command R4 may be transmitted to the nonvolatile memory 110 through the memory access 129 after being sliced and translated according to the translation unit in the translation layer 128. The count of the counter CT may be increased (e.g., to "2").

Since the count (e.g., 2) reaches the write threshold WT (e.g., 2), in operation S430, the second sub-command SC2 is fetched from the sub-queue 125. The second sub-command SC2 may be transmitted to the nonvolatile memory 110 through the memory access 129 after being sliced and translated according to the translation unit in the translation layer 128. In operation S435, the second sub-data element SD2 associated with the second sub-command SC2 may be transmitted from the data memory 123 to the nonvolatile memory 110 through the memory access 129. As the second sub-command SC2 is transmitted, the count of the counter CT may be reset (e.g., to "0")

Since the count (e.g., "0") is under the write threshold WT (e.g., "2"), in operation S440, the fifth read command R5 is fetched from the command queue 122. The fifth read command R5 may be transmitted to the nonvolatile memory 110 through the memory access 129 after being sliced and translated according to the translation unit in the translation layer 128. The count of the counter CT may be increased (e.g., to "1").

Since the count (e.g., "1") is under the write threshold WT (e.g., "2"), in operation S445, the second write command W2 is fetched from the command queue 122. It is assumed that the size (or address range) of second write data WD2 associated with the second write command W2 is two-times the slice unit. The second write command W2 may be sliced into two sub-commands, that is, fourth and fifth sub-commands SC4 and SC5 depending on the slice unit. The fourth and fifth sub-commands SC4 and SC5 may be enqueued in the sub-queue 125.

In operation S450, as the second write command W2 is sliced into the fourth and fifth sub-commands SC4 and SC5, the second write data WD2 may be sliced into fourth and fifth sub-data elements SD4 and SD5 in the data memory 123. For example, as an address range of the second write command W2 is sliced into address ranges of the fourth and fifth sub-commands SC4 and SC5, the second write data WD2 may be sliced conceptually rather than sliced actually. Since the fourth and fifth sub-commands SC4 and SC5 are not the first sub-commands, the count is maintained (e.g., at "1").

Since the count (e.g., "1") is under the write threshold WT (e.g., "2"), in operation S455, the sixth read command R6 is fetched from the command queue 122. The sixth read command R6 may be transmitted to the nonvolatile memory 110 through the memory access 129 after being sliced and translated according to the translation unit in the translation layer 128. The count of the counter CT may be increased (e.g., to "2").

Since the count (e.g., "2") reaches the write threshold WT (e.g., "2"), in operation S460, the third sub-command SC3 is fetched from the sub-queue 125. The third sub-command SC3 may be transmitted to the nonvolatile memory 110 through the memory access 129 after being sliced and translated according to the translation unit in the translation layer 128. In operation S465, the third sub-data element SD3 associated with the third sub-command SC3 may be transmitted from the data memory 123 to the nonvolatile memory 110 through the memory access 129. As the third sub-command SC3 is transmitted, the count of the counter CT may be reset (e.g., to "0")

In the embodiments described with reference to FIGS. 5 to 7, the first write command W1 may be divided into the first to third sub-commands SC1 to SC3 and may be gradually (or stepwise) processed. The third to sixth read commands R3 to R6 received later than the first write command W1 are processed while the first write command W1 is gradually processed. After the third to sixth read commands R3 to R6 are processed, the first write command W1 may be completely processed. Accordingly, it may be possible to prevent processing of the third to sixth read commands R3 to R6 from being delayed by the first write command W1.

Figure 8:
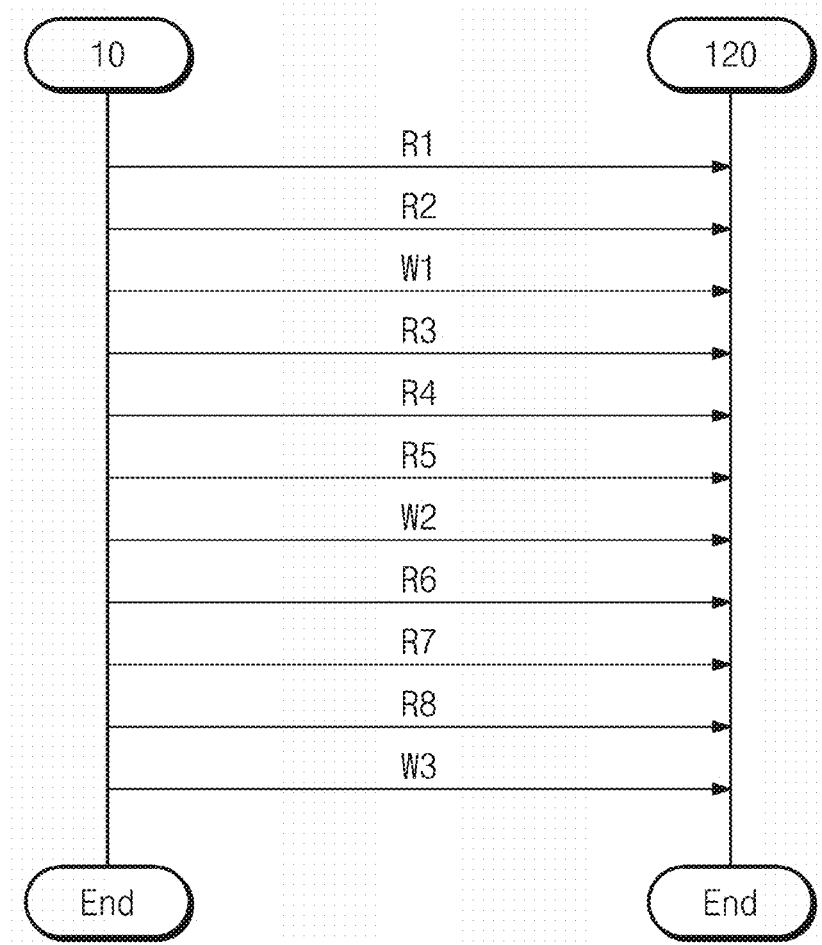
FIG. 8 illustrates an example of commands that an external host device transmits to the controller.

FIG. 8 illustrates an example of commands that the external host device 10 transmits to the controller 120. Referring to FIGS. 1 and 8, the external host device 10 may sequentially transmit the first and second read commands R1 and R2, the first write command W1, the third to fifth read commands R3 to R5, the second write command W2, the sixth to eighth read commands R6 to R8, and the third write command W3 to the controller 120.

Figure 9:
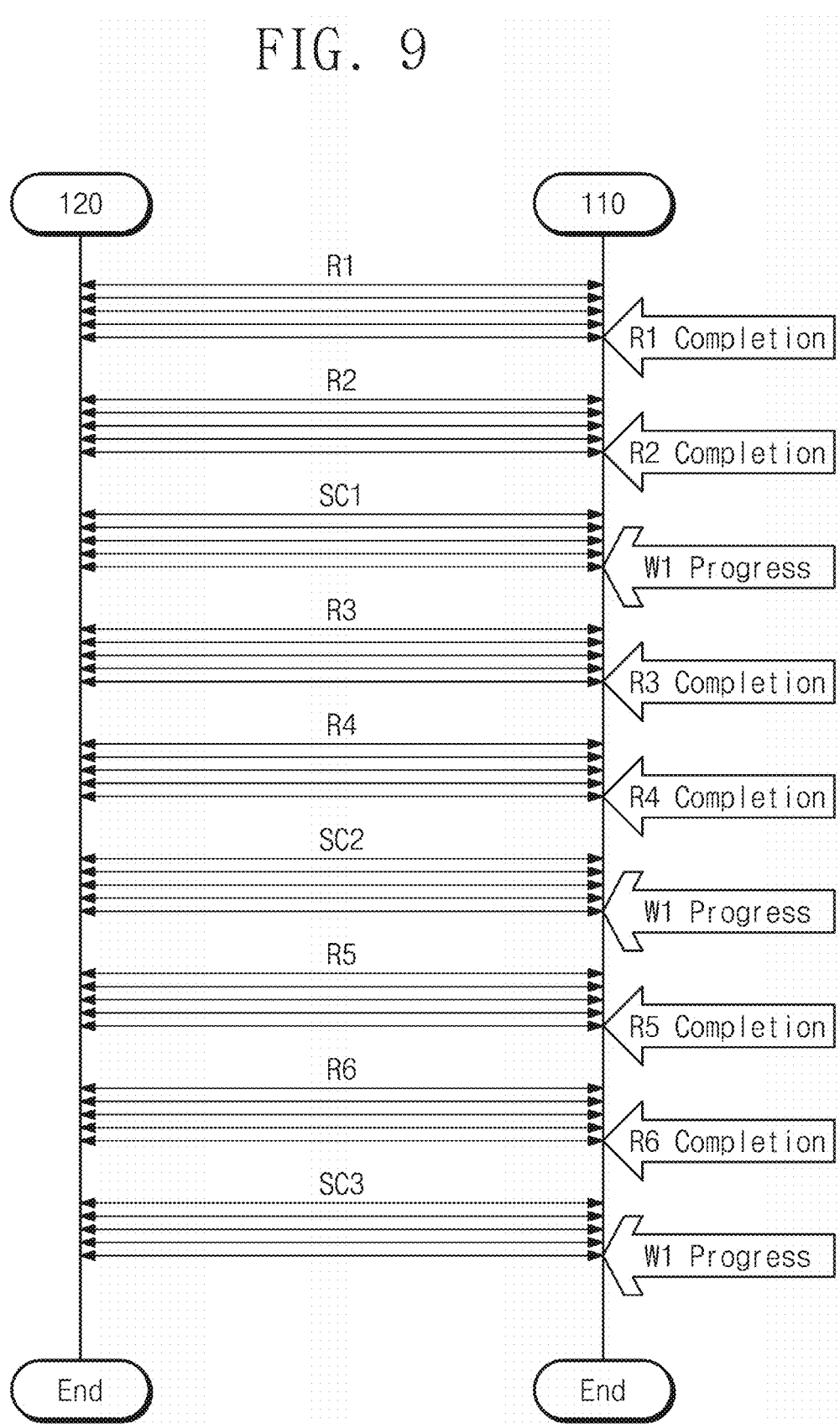
FIG. 9 illustrates an example in which the controller transmits device commands to a nonvolatile memory when a command is received in the controller depending on a sequence of FIG. 8.

FIG. 9 illustrates an example in which the controller 120 transmits device commands to the nonvolatile memory 110 when a command is received in the controller 120 depending on the sequence of FIG. 8. Referring to FIGS. 1, 8, and 9, as the external host device 10 transmits the first and second read commands R1 and R2 to the controller 120, the controller 120 may transmit the first and second read commands R1 and R2 to the nonvolatile memory 110.

The controller 120 may slice an address range of each of the first and second read commands R1 and R2 depending on the translation unit to generate device read commands and may transmit the device read commands to the nonvolatile memory 110. The device read commands may be marked in FIG. 9 by a plurality of arrows corresponding to the first and second read commands R1 and R2.

The controller 120 may complete a read operation by transmitting the first read command R1 to the nonvolatile memory 110 and may complete a read operation by transmitting the second read command R2 to the nonvolatile memory 110. As the external host device 10 transmits the first write command W1, the controller 120 may slice an address range of the first write command W1 to generate sub-commands.

The controller 120 may transmit one (e.g., SC1) of the sub-commands SC1 to SC3 to the nonvolatile memory 110. The controller 120 may slice an address range of the first sub-command SC1 depending on the translation unit to generate device commands and may transmit the device commands to the nonvolatile memory 110. The device commands may be marked in FIG. 9 by a plurality of arrows corresponding to the first sub-command SC1.

If the first sub-command SC1 is transmitted, a write operation corresponding to the first write command W1 progresses in the nonvolatile memory 110. As the external host device 10 transmits the third and fourth read commands R3 and R4, the controller 120 may transmit the third and fourth read commands R3 and R4 to the nonvolatile memory 110. Read operations may be completed as the third and fourth read commands R3 and R4 are transmitted.

The controller 120 may transmit another (e.g., SC2) of the sub-commands SC1 to SC3 to the nonvolatile memory 110. If the second sub-command SC2 is transmitted, the write operation corresponding to the first write command W1 progresses in the nonvolatile memory 110. As the external host device 10 transmits the fifth and sixth read commands R5 and R6, the controller 120 may transmit the fifth and sixth read commands R5 and R6 to the nonvolatile memory 110. Read operations may be completed as the fifth and sixth read commands R5 and R6 are transmitted.

The controller 120 may transmit another (e.g., SC3) of the sub-commands SC1 to SC3 to the nonvolatile memory 110. If the third sub-command SC3 is transmitted, the write operation corresponding to the first write command W1 progresses in the nonvolatile memory 110. For example, the write operation corresponding to the first write command W1 progresses, thus being completed.

According to at least one example embodiment of the inventive concepts, when an order to process a write command arrives by scheduling, the controller 120 slices an address range of a write command to stepwise process the write command. The sliced sub-commands are alternately processed with read commands received next to the write command. Accordingly, it may be possible to prevent subsequent read operations from being delayed by a high-capacity write operation.

Figure 10:
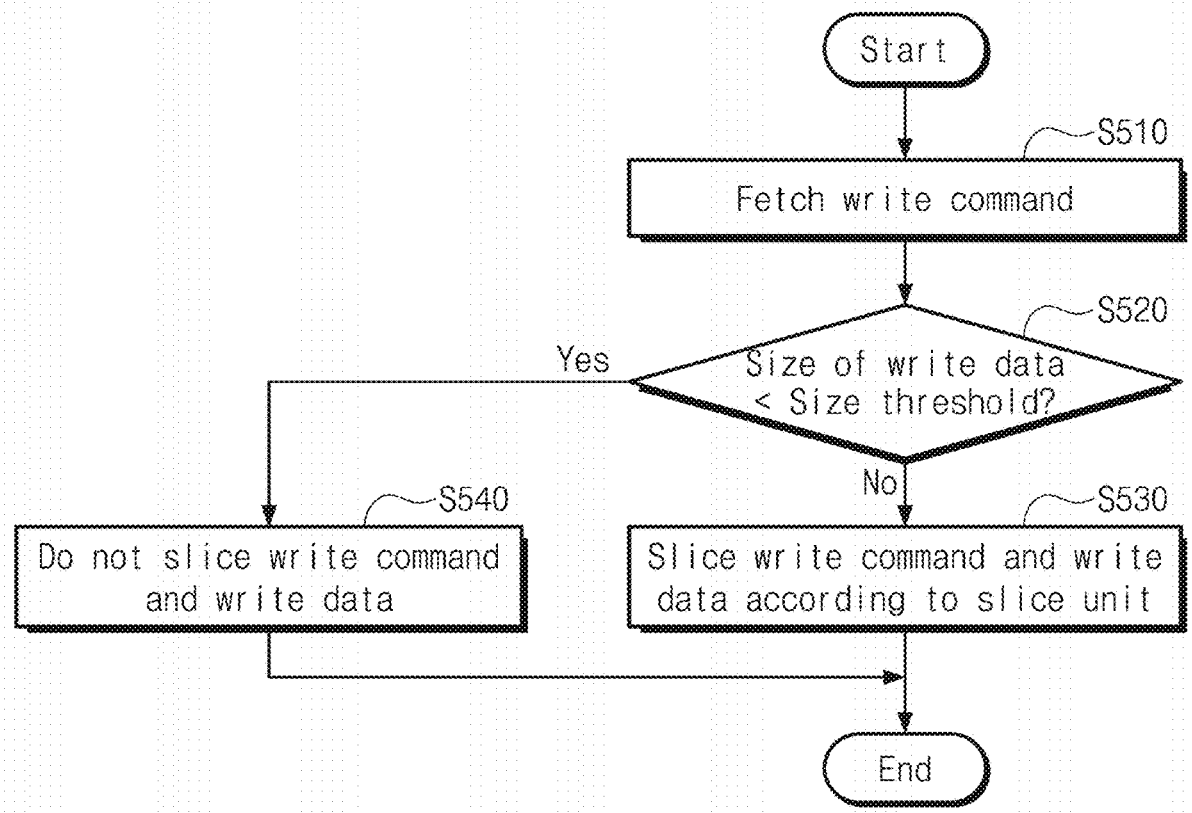
FIG. 10 is a flowchart illustrating an example in which the controller determines whether to slice depending on a size of write data.

FIG. 10 is a flowchart illustrating an example in which the controller 120 determines whether to slice depending on the size of write data. Referring to FIGS. 1, 3, and 10, in operation S510, the slicer 124 may fetch a write command from the command queue 122. In operation S520, the slicer 124 may determine whether the size of write data associated with the write command is under a size threshold.

If the size of write data associated with the write command is not under the size threshold, that is, if the size of write data associated with the write command is the same as or larger than the size threshold, in operation S530, the slicer 124 may slice the write command and the write data depending on the slice unit to generate sub-commands and sub-data elements. The sub-commands are enqueued in the sub-queue 125.

If the size of write data associated with the write command is under the size threshold, in operation S540, the slicer 124 may not slice the write command and the write data. For example, the slicer 124 may enqueue the write command in the sub-queue 125 without slicing. The write command enqueued in the sub-queue 125 may be managed and processed the same as other sub-commands enqueued. That is, it may be understood that the write command is recognized as a sub-command.

Figure 11:
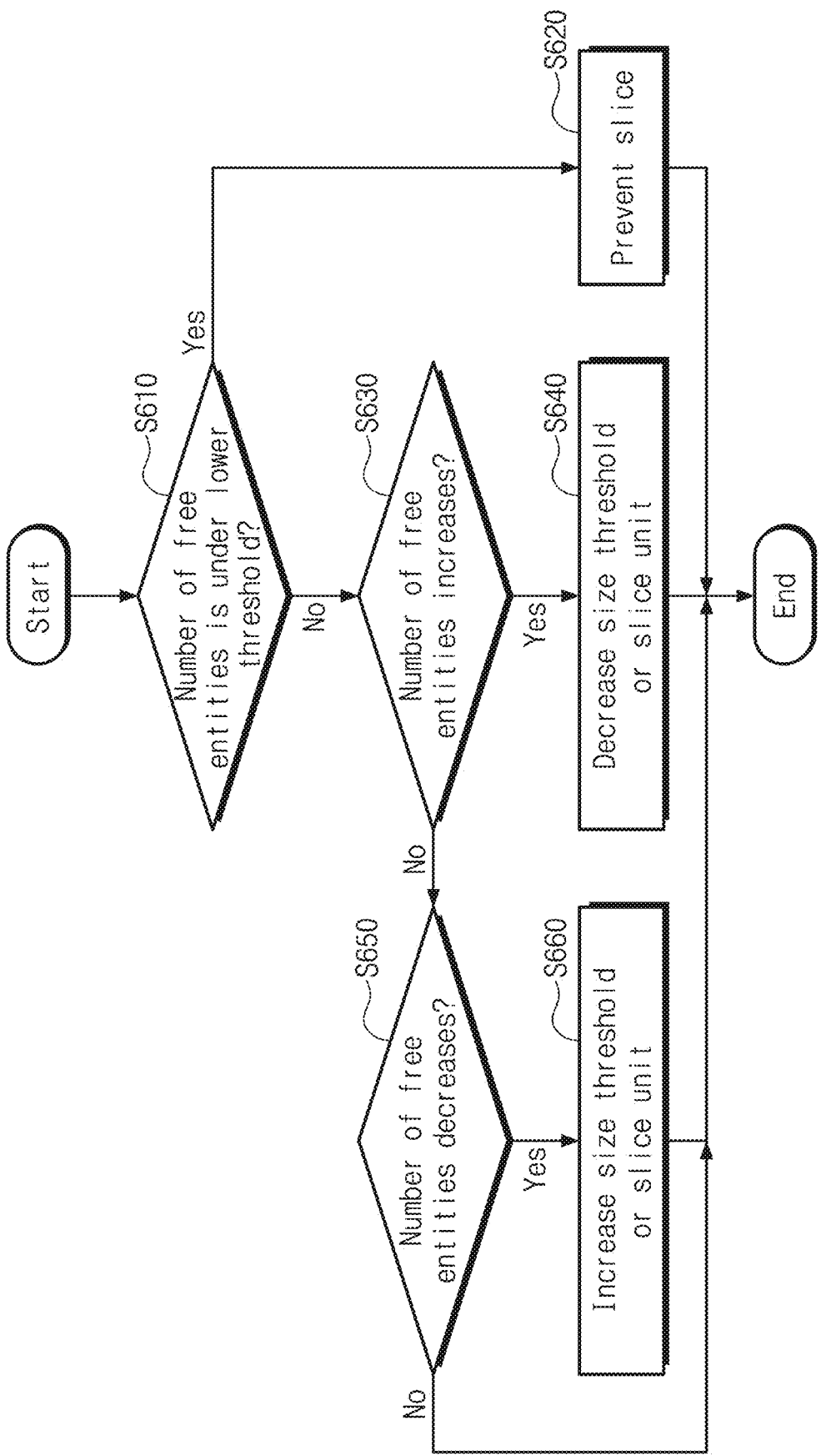
FIG. 11 is a flowchart illustrating an example in which the controller adjusts a size threshold or a slice unit.

FIG. 11 is a flowchart illustrating an example in which the controller 120 adjusts a size threshold or a slice unit. In an embodiment, operations illustrated in FIG. 11 may be performed by the slicer 124, by the scheduler 127, or by separate logic added to the controller 120. Referring to FIGS. 1, 3, and 11, in operation S610, there is determined whether the number of free entities of the sub-queue 125 is under a lower threshold.

For example, the controller 120 may know the number of the free entities and whether the number of free entities increases or decreases because the controller itself increases the number of the free entities by fetching sliced or unsliced write command from the sub-queue 125 and decreases the number of the free entities by enqueueing the sliced or unsliced write command into the sub-queue 125.

If the number of free entities is under the lower threshold, in operation S620, slicing is prevented. The slicer 124 may not slice a write command or write data regardless of the size of an address range associated with the write command or the size of the write data. The slicer 124 may enqueue the write command in the sub-queue 125 without slicing.

If the number of free entities is not under the lower threshold, operation S630 is performed. In operation S630, there is determined whether the number of free entities increases. For example, the number of free entities may be ranged. The number of free entities belonging to a first range may be under the number of free entities belonging to a second range. Whether the number of free entities increases and is changed from the first range to the second range may be determined.

If the number of free entities increases, in operation S640, the size threshold or the slice unit may decrease. If the size threshold decreases, a write command associated with write data of a smaller size is targeted for slicing. That is, more write commands may be targeted for slicing. If the slice unit decreases, a write command may be sliced into more sub-commands. That is, a delay of read commands may further decrease.

If the number of free entities does not increase, operation S650 is performed. In operation S650, there is determined whether the number of free entities decreases. For example, whether the number of entities decreases and is changed from the second range to the first range may be determined.

If the number of free entities decreases, in operation S660, the size threshold or the slice unit may increase. If the size threshold increases, a write command associated with write data of a small size is released from a slice target. That is, fewer write commands may be targeted for slicing. If the slice unit increases, a write command may be sliced into fewer sub-commands. That is, a delay of the write command may further decrease. If the number of free entities does not decrease, the size threshold or the slice unit is maintained without change.

In an embodiment, the adjustment of the size threshold or the slice unit illustrated in FIG. 11 may be performed when the slicer 124 fetches a write command or a sub-command from the command queue 122 or the sub-queue 125, when the slicer 124 fetches the specific number of write commands or sub-commands from the command queue 122 or the sub-queue 125, when a range to which the number of free entities of the sub-queue 125 belongs is changed, or by a request of a control block such as the scheduler 127.

Figure 12:
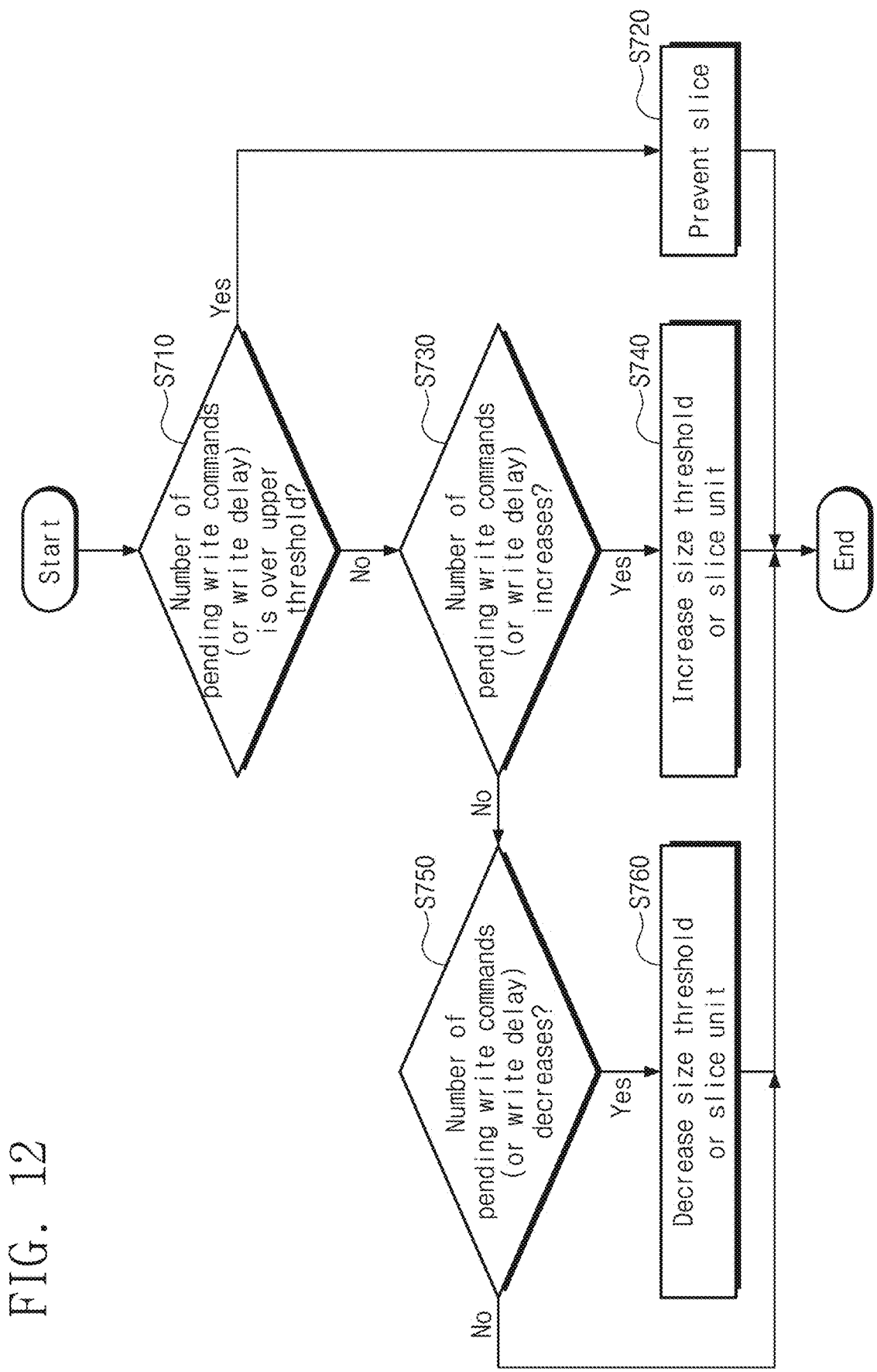
FIG. 12 is a flowchart illustrating another example in which the controller adjusts a size threshold or a slice unit.

FIG. 12 is a flowchart illustrating another example in which the controller 120 adjusts a size threshold or a slice unit. In an embodiment, operations illustrated in FIG. 12 may be performed by the slicer 124, by the scheduler 127, or by separate logic added to the controller 120. Referring to FIGS. 1, 3, and 12, in operation S710, there is determined whether the number of write commands pending in the controller 120 (or a write delay amount) is over an upper threshold.

If the number of pending write commands (or the write delay amount) exceeds the upper threshold, in operation S720, slicing is prevented. The slicer 124 may not slice a write command or write data regardless of the size of an address range associated with the write command or the size of the write data. The slicer 124 may enqueue the write command in the sub-queue 125 without slicing.

If the number of pending write commands (or the write delay amount) does not exceed the upper threshold, operation S730 is performed. In operation S730, there is determined whether the number of pending write commands (or the write delay amount) increases. For example, the number of pending write commands (or the write delay amount) may be ranged. The number of pending write commands (or a write delay amount) belonging to a first range may be under the number of pending write commands (or a write delay amount) belonging to a second range. Whether the number of pending write commands (or the write delay amount) increases and is changed from the first range to the second range may be determined.

If the number of pending write commands (or the write delay amount) increases, in operation S740, the size threshold or the slice unit may increase. If the size threshold increases, a write command associated with write data of a small size is released from a slice target. That is, fewer write commands may be targeted for slicing. If the slice unit increases, a write command may be sliced into fewer sub-commands. That is, a delay of the write command may further decrease.

If the number of pending write commands (or the write delay amount) does not increase, operation S750 is performed. In operation S750, there is determined whether the number of pending write commands (or the write delay amount) decreases. For example, whether the number of pending write commands (or the write delay amount) decreases and is changed from the second range to the first range may be determined.

If the number of pending write commands (or the write delay amount) decreases, in operation S760, the size threshold or the slice unit may decrease. If the size threshold decreases, a write command associated with write data of a smaller size is targeted for slicing. That is, more write commands may be targeted for slicing. If the slice unit decreases, a write command may be sliced into more sub-commands. That is, a delay of read commands may further decrease. If the number of pending write commands (or the write delay amount) does not decrease, the size threshold or the slice unit is maintained without change.

In an embodiment, the adjustment of the size threshold or the slice unit illustrated in FIG. 12 may be performed when the slicer 124 fetches a write command or a sub-command from the command queue 122 or the sub-queue 125, when the slicer 124 fetches the specific number of write commands or sub-commands from the command queue 122 or the sub-queue 125, when a range to which the number of write commands (or the write delay amount) belongs is changed, or by a request of a control block such as the scheduler 127.

Figure 13:
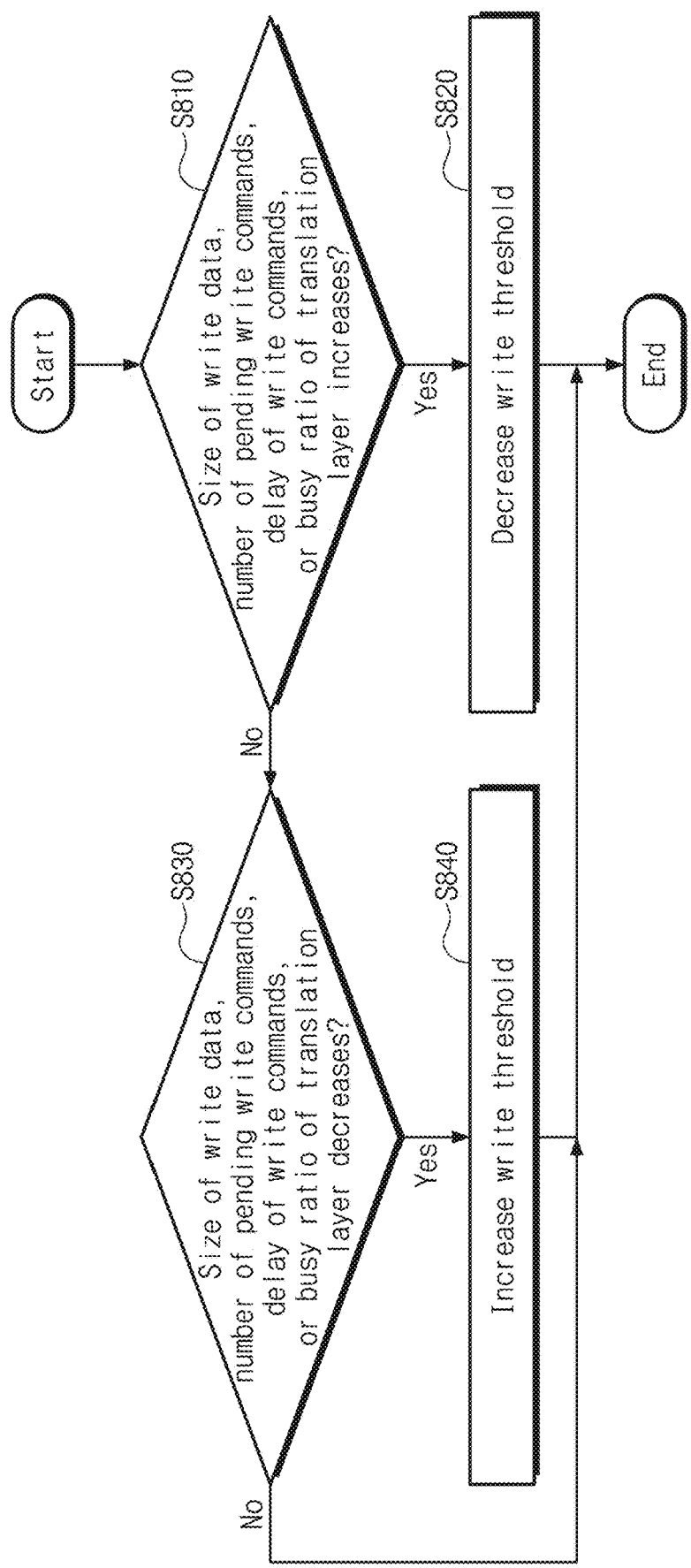
FIG. 13 is a flowchart illustrating an example in which the controller adjusts a write threshold.

FIG. 13 is a flowchart illustrating an example in which the controller 120 adjusts a write threshold. In an embodiment, operations illustrated in FIG. 13 may be performed by the scheduler 127, or by separate logic added to the controller 120. Referring to FIGS. 1, 3, and 13, in operation S810, there is determined whether the size of write data, the number of pending write commands, a delay amount of write commands, or a busy ratio of the translation layer 128 increases.

For example, the size of write data, the number of pending write commands, the delay amount of write commands, or the busy ratio of the translation layer 128 may be ranged. The size of write data, the number of pending write commands, the delay amount of write commands, or the busy ratio of the translation layer 128 belonging to a first range may be under the size of write data, the number of pending write commands, the delay amount of write commands, or the busy ratio of the translation layer 128 belonging to a second range.

Whether the size of write data, the number of pending write commands, the delay amount of write commands, or the busy ratio of the translation layer 128 increases and is changed from the first range to the second range may be determined. The increase in the size of write data, the number of pending write commands, or the delay amount of write commands may be understood as a demand on write processing increases. The increase in the busy ratio of the translation layer 128 may be understood as a demand on reducing the work load of the translation layer 128 increases.

Accordingly, in operation S820, the write threshold decreases. If the write threshold decreases, the number of read commands between sequent sub-commands decreases. That is, the controller 120 may increase a processing ratio of a write command to a read command. The write command is associated with write data for a range of sequent addresses. Accordingly, the work load of the translation layer 128 also decreases.

If the size of write data, the number of pending write commands, the delay amount of write commands, or the busy ratio of the translation layer 128 does not increase, operation S830 is performed. In operation S830, there is determined whether the size of write data, the number of pending write commands, the delay amount of write commands, or a busy ratio of the translation layer 128 decreases.

For example, whether the size of write data, the number of pending write commands, the delay amount of write commands, or the busy ratio of the translation layer 128 decreases and is changed from the second range to the first range may be determined. The decrease in the size of write data, the number of pending write commands, or the delay amount of write commands may be understood as a demand on write processing decreases. The increase in the busy ratio of the translation layer 128 may be understood as a demand on reducing the work load of the translation layer 128 decreases.

Accordingly, in operation S840, the write threshold increases. If the write threshold increases, the number of read commands between sequent sub-commands increases. That is, the controller 120 may increase a processing ratio of a write command to a read command. The read command is associated with discontinuous address ranges. Accordingly, the work load of the translation layer 128 also increases. If the size of write data, the number of pending write commands, the delay amount of write commands, or the busy ratio of the translation layer 128 does not decrease, the write threshold is maintained without change.

In an embodiment, the adjustment of the write threshold illustrated in FIG. 13 may be performed when the slicer 124 fetches a write command or a sub-command from the command queue 122 or the sub-queue 125, when the slicer 124 fetches the specific number of write commands or sub-commands from the command queue 122 or the sub-queue 125, when a range to which the number of pending write commands, the delay amount of write commands, or the busy ratio of the translation layer 128 belongs is changed, or by a request of a control block such as the scheduler 127.

Figure 14:
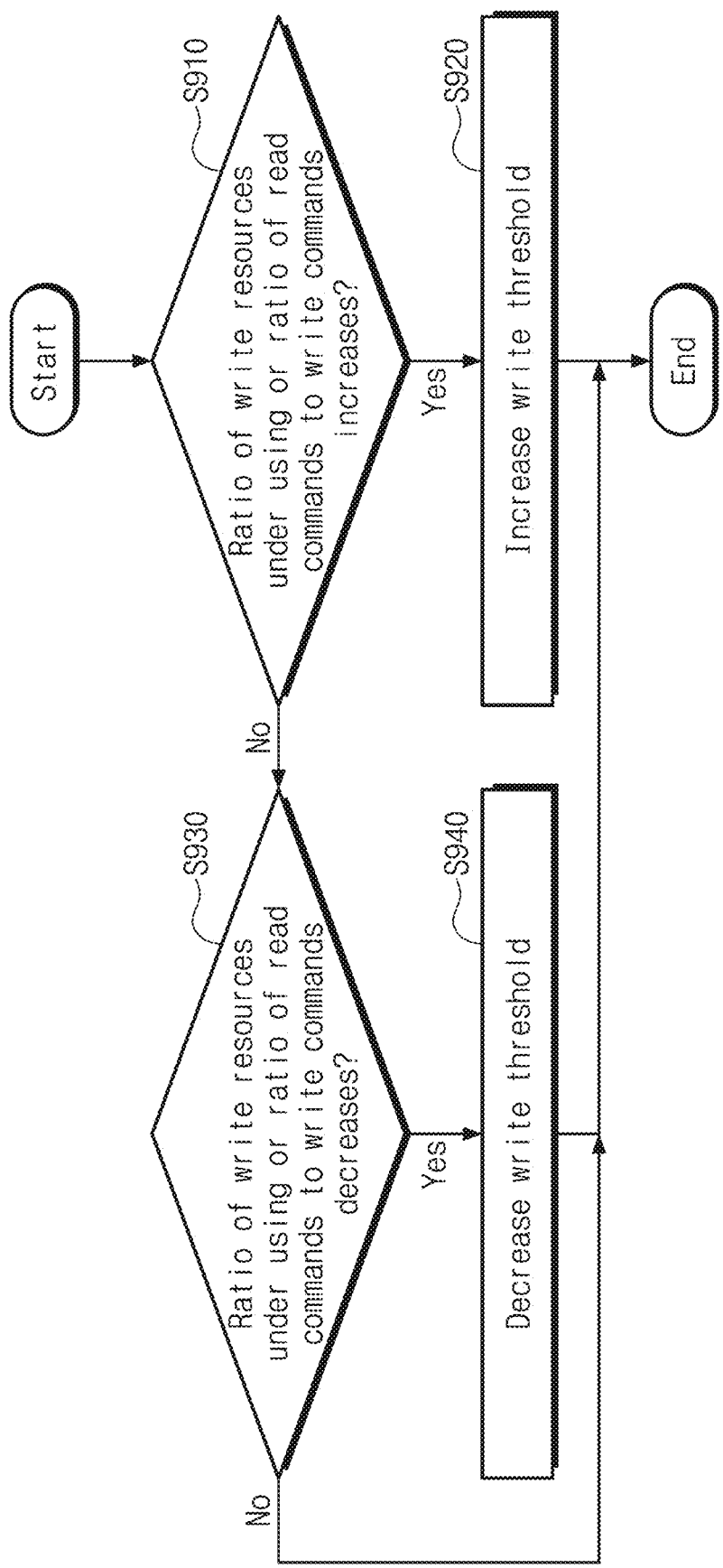
FIG. 14 is a flowchart illustrating another example in which the controller adjusts a write threshold.

FIG. 14 is a flowchart illustrating another example in which the controller 120 adjusts a write threshold. In an embodiment, operations illustrated in FIG. 14 may be performed by the scheduler 127, or by separate logic added to the controller 120. Referring to FIGS. 1, 3, and 14, in operation S910, there is determined whether a ratio of write resources under use or a ratio of read commands to write commands increases. According to at least some example embodiments of the inventive concepts, the ratio of write resources under use is a ratio of (i) the write resources currently being used by the controller to (ii) the maximum write resources available to the controller.

For example, the ratio of write resources under use or the ratio of read commands to write commands may be ranged. The ratio of write resources under use or the ratio of read commands to write commands belonging to a first range may be under the ratio of write resources under use or the ratio of read commands to write commands belonging to a second range.

Whether the ratio of write resources under use or the ratio of read commands to write commands increases and is changed from the first range to the second range may be determined. The increase in the ratio of write resources under use may be understood as the work load of a write operation increases. The increase in the ratio of read commands to write commands may be understood as a demand on processing a read operation increases.

Accordingly, in operation S920, the write threshold increases. If the write threshold increases, the number of read commands between sequent sub-commands increases. That is, the controller 120 may increase a processing ratio of a read command to a write command. Since the write command is processed less frequently, the usage of write resources may decrease.

Whether the ratio of write resources under use or the ratio of read commands to write commands does not increase, operation S930 is performed. In operation S930, there is determined the ratio of write resources under use or the ratio of read commands to write commands decreases.

Whether the ratio of write resources under use or the ratio of read commands to write commands decreases and is changed from the second range to the first range may be determined. The decrease in the ratio of write resources under use may be understood as the write resources are sufficient. The decrease in the ratio of read commands to write commands may be understood as a demand on processing a write operation increases.

Accordingly, in operation S940, the write threshold decreases. If the write threshold decreases, the number of read commands between sequent sub-commands decreases. That is, the controller 120 may increase a processing ratio of a write command to a read command. Whether the ratio of write resources under use or the ratio of read commands to write commands does not decrease, the write threshold is maintained without change.

In an embodiment, the adjustment of the write threshold illustrated in FIG. 14 may be performed when the slicer 124 fetches a write command or a sub-command from the command queue 122 or the sub-queue 125, when the slicer 124 fetches the specific number of write commands or sub-commands from the command queue 122 or the sub-queue 125, when a range to which the number of pending write commands, the delay amount of write commands, or the busy ratio of the translation layer 128 belongs is changed, or by a request of a control block such as the scheduler 127.

In an embodiment, in FIGS. 11 to 14, At least some example embodiments of the inventive concepts are described with reference to the first and second ranges. However, according to at least some example embodiments, the number of ranges is not limited "2." For example, according to at least some example embodiments of the inventive concepts, the number of ranges may be variously changed or modified and may be different than 2.

Figure 15:
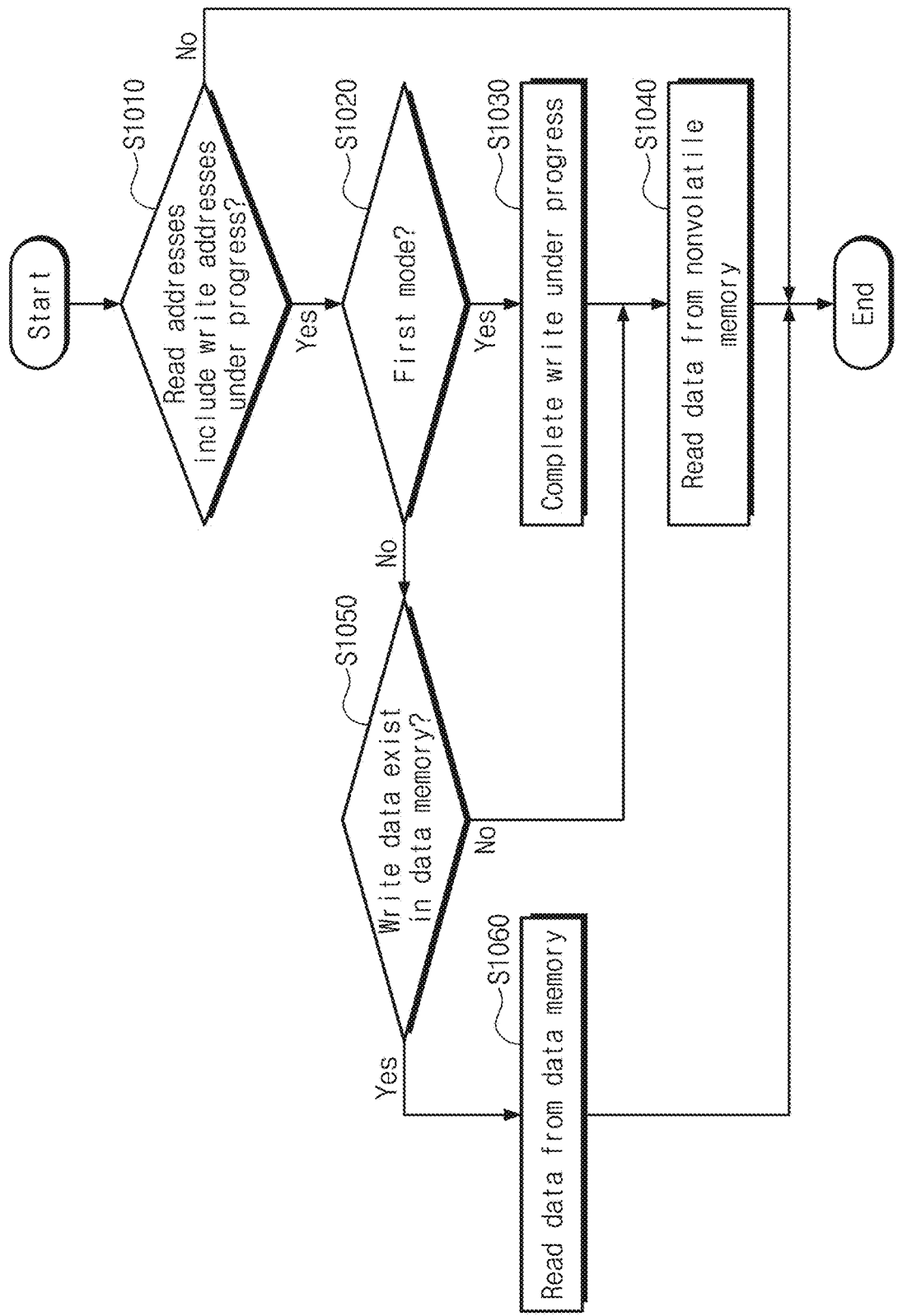
FIG. 15 is a flowchart illustrating an example when addresses of read commands and addresses of write commands are the same.

FIG. 15 is a flowchart illustrating an example when addresses of read commands and addresses of write commands are the same. Referring to FIGS. 1, 3, and 15, in operation S1010, the scheduler 127 may determine whether read addresses of a read command fetched from the command queue 122 include write addresses of a write command under progress. The write command under progress means a write command, the sub-commands of which are pending in the sub-queue 125.

In operation S1020, the scheduler 127 determines whether the controller 120 is set to a first mode or a second mode. For example, the first mode may be a write-preferred mode, and a second mode may be a read-preferred mode. If it is determined that the controller 120 is set to the first mode, operation S1030 is performed.

In operation S1030, the scheduler 127 may control the selector 126 such that a write operation under progress is completed. For example, the scheduler 127 may allow the selector 126 not to select the command queue 122 and to select the sub-queue 125 until the write operation under progress is completed.

For example, in the case where any other sub-commands are stored before sub-commands of a write command associated with a read command, the scheduler 127 may allow the selector 126 to select the sub-queue 125 until the other sub-commands are processed and sub-commands of the associated write command are processed.

As another example, the scheduler 127 may change locations of sub-commands in the sub-queue 125 until the sub-commands of the associated write command are processed prior to the other sub-commands. That is, the scheduler 127 may increase the priority of the sub-commands of the associated write command.

After the sub-commands of the associated write command are completely processed, in operation S1040, the scheduler 127 may allow the selector 126 to select the command queue 122. A read command associated with a write command is fetched from the command queue 122, and immediately, data written in the nonvolatile memory 110 may be read from the nonvolatile memory 110.

If it is determined that the controller 120 is set to the second mode, operation S1050 is performed. In operation S1050, the scheduler 127 determines whether write data associated with a read command are present in the data memory 123. If the associated write data are absent from the data memory 123, the scheduler 127 may allow the selector 126 to select the command queue 122. A read command associated with a write command is fetched from the command queue 122, and immediately, data written in the nonvolatile memory 110 may be read from the nonvolatile memory 110.

If the associated write data are present in the data memory 123, the scheduler 127 may allow the selector 126 to select the command queue 122. A read command associated with a write command is fetched from the command queue 122, and data may be read from the data memory 123 in response to the read command. If it is determined in operation S1010 that the read addresses do not include the write addresses under progress, the process ends.

In an embodiment, the controller 120 may be designed or manufactured to perform only one mode of the first and second modes, instead of processing a write operation or a read operation depending on a set mode of the first and second modes. In this case, the controller 120 may process the read operation or the write operation depending on the first mode or the second mode, and an operation of determining a mode, such as operation S1020, may be omitted.

Figure 16:
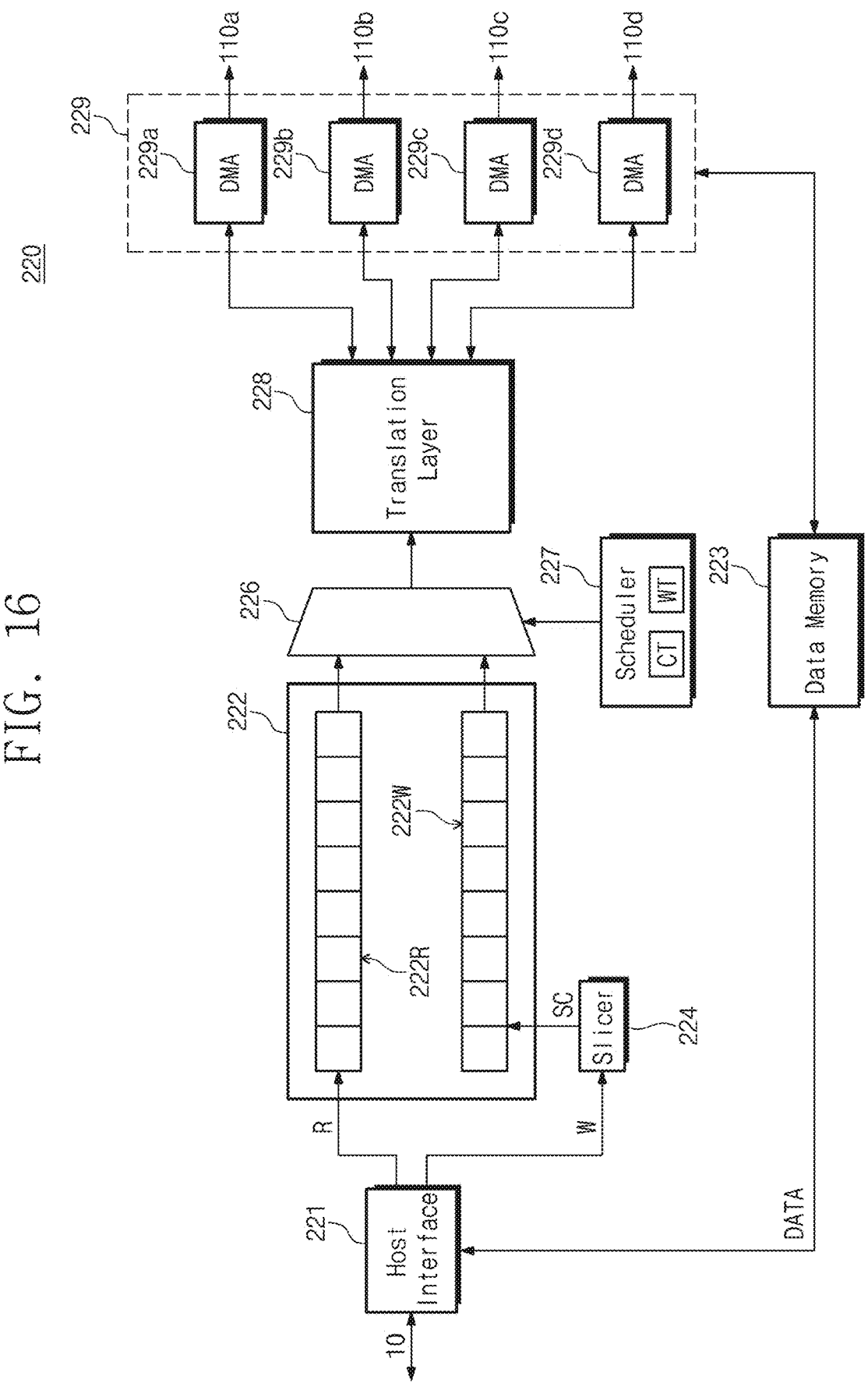
FIG. 16 is a block diagram illustrating an application example of the controller illustrated in FIG. 3.

FIG. 16 is a block diagram illustrating an application example of the controller 120 illustrated in FIG. 3. Referring to FIGS. 1 and 16, a controller 220 includes a host interface 221, a command queue 222, a data memory 223, a slicer 224, a selector 226, a scheduler 227, a translation layer 228, and a memory access 229. The scheduler 227 includes a counter CT and a write threshold WT, and the memory access 229 includes direct memory accesses 229a to 229d.

Compared with FIG. 3, the controller 220 does not include the sub-queue 125. The command queue 222 of the controller 220 includes a read command queue 222R and a write command queue 222W. A read command "R" transmitted from the host interface 221 may be enqueued in the read command queue 222R. A write command "W" transmitted from the host interface 221 may be enqueued in the write command queue 222W.

The slicer 224 may receive thee write command "W" and may slice the received write command "W". For example, as described with reference to FIGS. 1 to 14, the slicer 224 may slice the write command "W" depending on the slice unit and the size threshold. The slicer 224 may enqueue sub-commands SC generated by slicing the write command "W" in the write command queue 222W. In the case where slicing is prevented, the slicer 224 may enqueue the write command "W" in the write command queue 222W without slicing.

The controller 220 is implemented the same as the controller 120 described with reference to FIG. 3, except that functions of the command queue 222 and the slicer 224 are changed. Accordingly, a description of duplicated components will not be repeated here.

Figure 17:
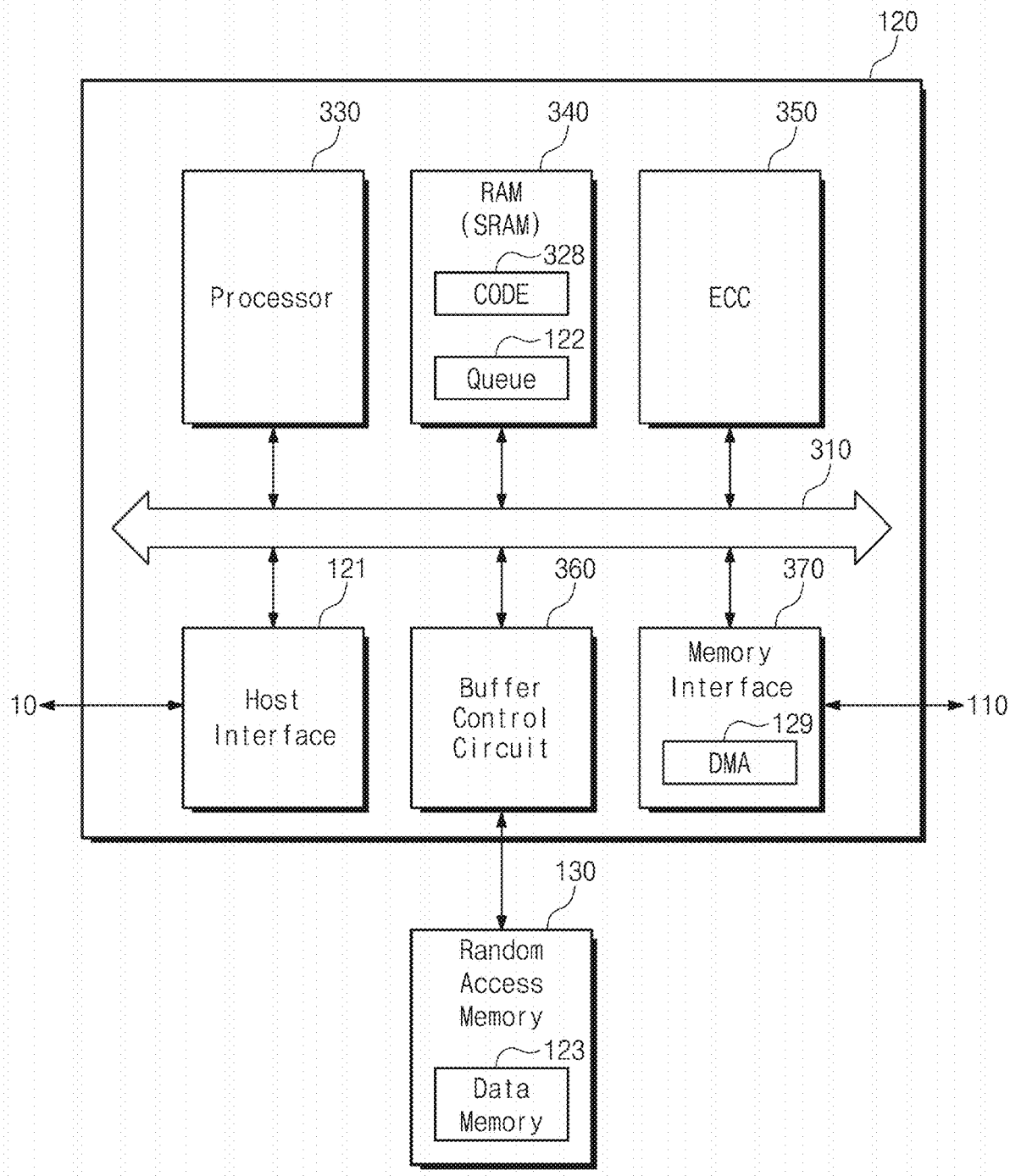
FIG. 17 is a block diagram illustrating an example in which the controller of FIG. 3 or the controller of FIG. 16 is implemented with hardware.

FIG. 17 is a block diagram illustrating an example in which the controller 120 of FIG. 3 or the controller 220 of FIG. 16 is implemented with hardware. Referring to FIGS. 1 and 17, the controller 120 includes a bus 310, a processor 330, an internal random access memory 340, an error correction block 350, the host interface 121, a buffer control circuit 360, and a memory interface 370. The processor 330 may be or include a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multi-core processor; a multi-processor, an application-specific integrated circuit (ASIC), and a field programmable gate array (FPGA). Processors executing program code are programmed processors, and thus, are special-purpose computers.

The bus 310 is configured to provide a channel among components of the controller 120. The processor 330 may control overall operations of the controller 120 and may execute a logical operation. The processor 330 may communicate with an external host device through the host interface 121, may communicate with the nonvolatile memory 110 through the memory interface 370, and may communicate with the random access memory 130 through the buffer control circuit 360.

The processor 330 may control the storage device 100 by using the internal random access memory 340 as a working memory, a cache memory, or a buffer memory. The processor 330 may include a first processor that is specially designed or manufactured to be wholly responsible for communication or work with a host and a second processor specially designed or manufactured to be wholly responsible for communication or jobs with the nonvolatile memory 110.

The internal random access memory 340 may be used as a working memory or a cache memory of the processor 330. The internal random access memory 340 may store codes 328 or commands that the processor 330 will execute. The codes 328 may be, for example, computer-executable instructions designed or manufactured to cause a processor (e.g., the processor 330) that executes the computer-executable instructions to perform and/or control any or all of the functions described in the present disclosure as being performed by the controller 120, an element thereof (e.g., the slicer 124, the selector 126, the scheduler 127, the translation layer 128, and the memory access 129), the controller 220, or an element thereof (e.g., the slicer 224, the selector 226, the scheduler 227, the translation layer 228, and the memory access 229).

The internal random access memory 340 may include the command queue 122. The processor 330 may enqueue commands received through the host interface 121 in the command queue 122. The processor 330 may fetch and process a command from the command queue 122. The internal random access memory 340 may include a static RAM (SRAM).

The error correction block 350 may perform error correction. The error correction block 350 may perform error correction encoding based on data to be written in the nonvolatile memory 110 through the memory interface 370. The error correction encoded data may be provided to the nonvolatile memory 110 through the memory interface 370. The error correction block 350 may perform error correction decoding on data received through the memory interface 370 from the nonvolatile memory 110. In an embodiment, the error correction block 350 may be included in the memory interface 370 as a component of the memory interface 370.

The host interface 121 may communicate with the external host device 10 under control of the processor 330. The host interface 121 may be configured to make communication by using at least one of various communication manners, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer control circuit 360 may control the random access memory 130 under control of the processor 330. The memory interface 370 is configured to communicate with the nonvolatile memory 110 under control of the processor 330. The memory interface 370 may convey a command, an address, and data to the nonvolatile memory 110 through an input/output channel. The memory interface 370 may convey a control signal to the nonvolatile memory 110 through a control channel. The memory interface 370 may include the memory access 129.

The random access memory 130 may be used as the data memory 123. In an embodiment, in the case where the storage device 100 does not include the random access memory 130, the controller 120 may not include the buffer control circuit 360. In this case, instead of the random access memory 130, the internal random access memory 340 may be used as the data memory 123.

In an embodiment, the processor 330 may control the controller 120 by using the codes 328. The processor 330 may load the codes 328 from a nonvolatile memory (e.g., a read only memory) that is implemented in the controller 120. As another example, the processor 330 may load the codes 328 from the nonvolatile memory 110 through the memory interface 370.

Figure 18:
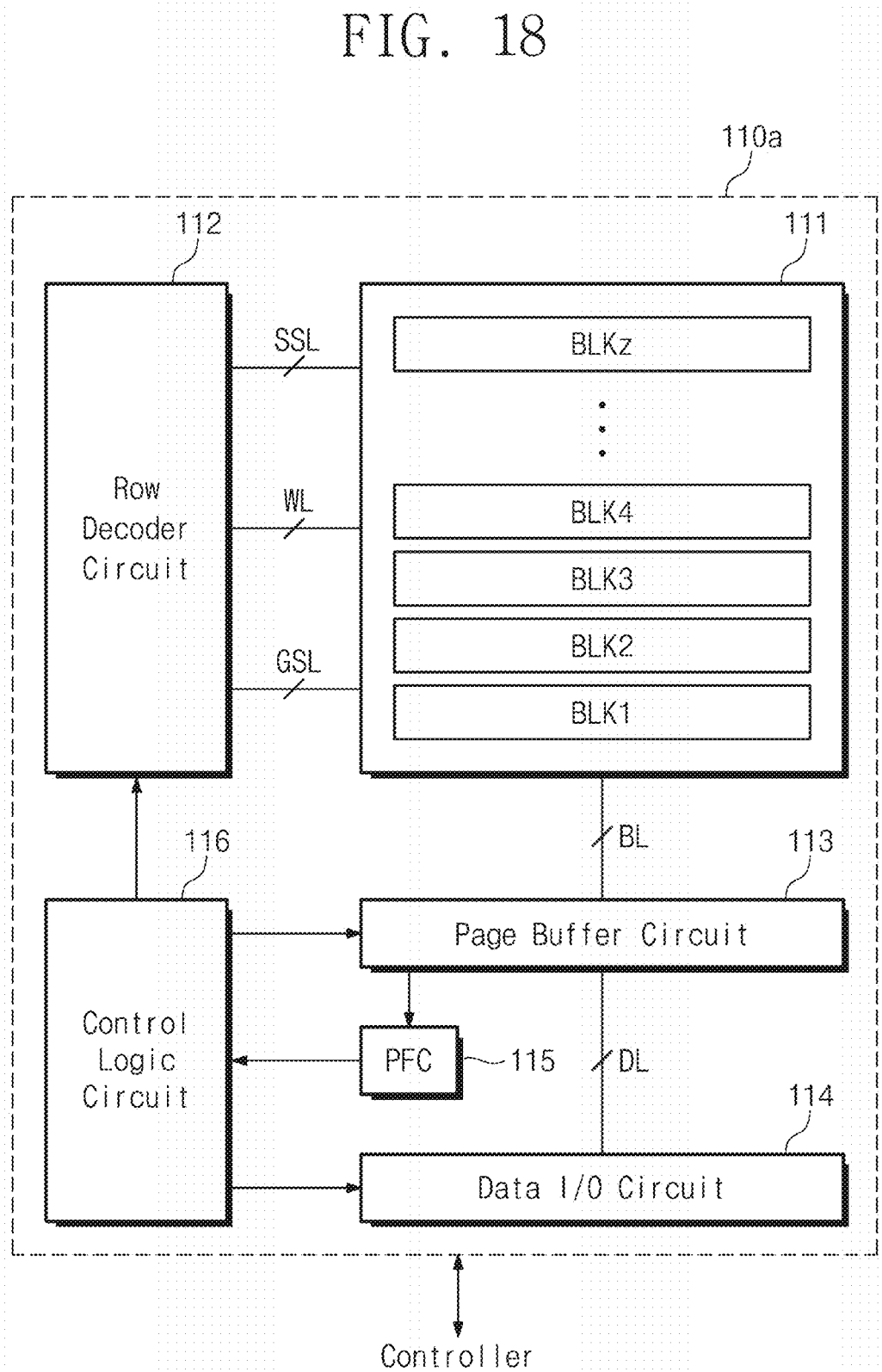
FIG. 18 is a block diagram illustrating a nonvolatile memory device according to at least one example embodiment of the inventive concepts.

FIG. 18 is a block diagram illustrating the nonvolatile memory device 110a according to at least one example embodiment of the inventive concepts. Referring to FIGS. 1 and 18, the nonvolatile memory device 110a includes a memory cell array 111, a row decoder circuit 112, a page buffer circuit 113, a pass-fail check circuit 115, a data input/output circuit 114, and a control logic circuit 116.

The memory cell array 111 includes a plurality of memory blocks BLK1 to BLKz. Each of the memory blocks BLK1 to BLKz includes a plurality of memory cells. Each of the memory blocks BLK1 to BLKz may be connected to the row decoder circuit 112 through at least one ground selection line GSL, a plurality of word lines WL, and at least one string selection line SSL.

Each of the memory blocks BLK1 to BLKz may be connected to the page buffer circuit 113 through a plurality of bit lines BL. The memory blocks BLK1 to BLKz may be connected in common to the bit lines BL. The memory cells of the memory blocks BLK1 to BLKz may have the same structure.

In an embodiment, each of the memory blocks BLK1 to BLKz may correspond to a unit of an erase operation. The memory cells of the memory cell array 111 may be erased for each memory block. The memory cells belonging to a memory block may be erased at the same time. As another example, each of the memory blocks BLK1 to BLKz may be divided into a plurality of sub-blocks. Each sub-block may correspond to a unit of an erase operation.

In an embodiment, each of the memory blocks BLK1 to BLKz may include a physical storage space which is distinguished by a block address. Each of the word lines WL may correspond to a physical storage space that is distinguished by a row address. Each of the bit lines BL may correspond to a physical storage space that is distinguished by a column address.

In an embodiment, each memory block may include a plurality of physical pages, each of which includes a plurality of memory cells. A physical page may refer to a program unit. Memory cells of each physical page may be simultaneously programmed. Each physical page may include two or more logical pages.

Bits to be programmed in memory cells of each physical page may constitute logical pages. First bits to be programmed in memory cells of each physical page may constitute a first logical page. K-th bits (K being a positive integer) to be programmed in the memory cells of each physical page may constitute a k-th logical page.

The row decoder circuit 112 is connected to the memory cell array 111 through a plurality of ground selection lines GSL, the plurality of word lines WL, and a plurality of string selection lines SSL. The row decoder circuit 112 operates under control of the control logic circuit 116. The row decoder circuit 112 may decode an address received from the controller 120 through an input/output channel and may control application of voltages to the string selection lines SSL, the word lines WL, and the ground selection lines GSL based on the decoded address.

The page buffer circuit 113 is connected to the memory cell array 111 through the bit lines BL. The page buffer circuit 113 is connected to the data input/output circuit 114 through a plurality of data lines DL. The page buffer circuit 113 operates under control of the control logic circuit 116.

The data input/output circuit 114 is connected with the page buffer circuit 113 through the data lines DL. The data input/output circuit 114 may output data, which are read by the page buffer circuit 113, to the controller 120 through the input/output channel and may transmit data, which are received from the controller 120 through the input/output channel, to the page buffer circuit 113.

After the verification read operation, the pass-fail check circuit 115 may receive a sensing result from the page buffer circuit 113. The pass-fail check circuit 115 may determine write or erase pass or fail based on the received sensing result.

The control logic circuit 116 may receive a command (e.g., a device command) through the input/output channel and a control signal through a control channel from the controller 120. The control logic circuit 116 may receive a command through the input/output channel in response to the control signal, may route an address, which is received through the input/output channel, to the row decoder circuit 112, and may route data, which is received through the input/output channel, to the data input/output circuit 114.

The control logic circuit 116 may decode the received command and may control the nonvolatile memory device 110a depending on the decoded command. For example, in the nonvolatile memory device 110a, the read operation may be performed in response to a read device command under control of the control logic circuit 116. In the nonvolatile memory device 110a, the write operation may be performed in response to a write device command under control of the control logic circuit 116.

Write data may be written in different memory cells, different logical pages, different physical pages, or different memory blocks depending on the sub-commands SC1 to SC3 (refer to FIG. 9). That is, sub-data elements corresponding to the sub-commands SC1 to SC3 may be written in different storage regions belonging to different address ranges.

Figure 19:
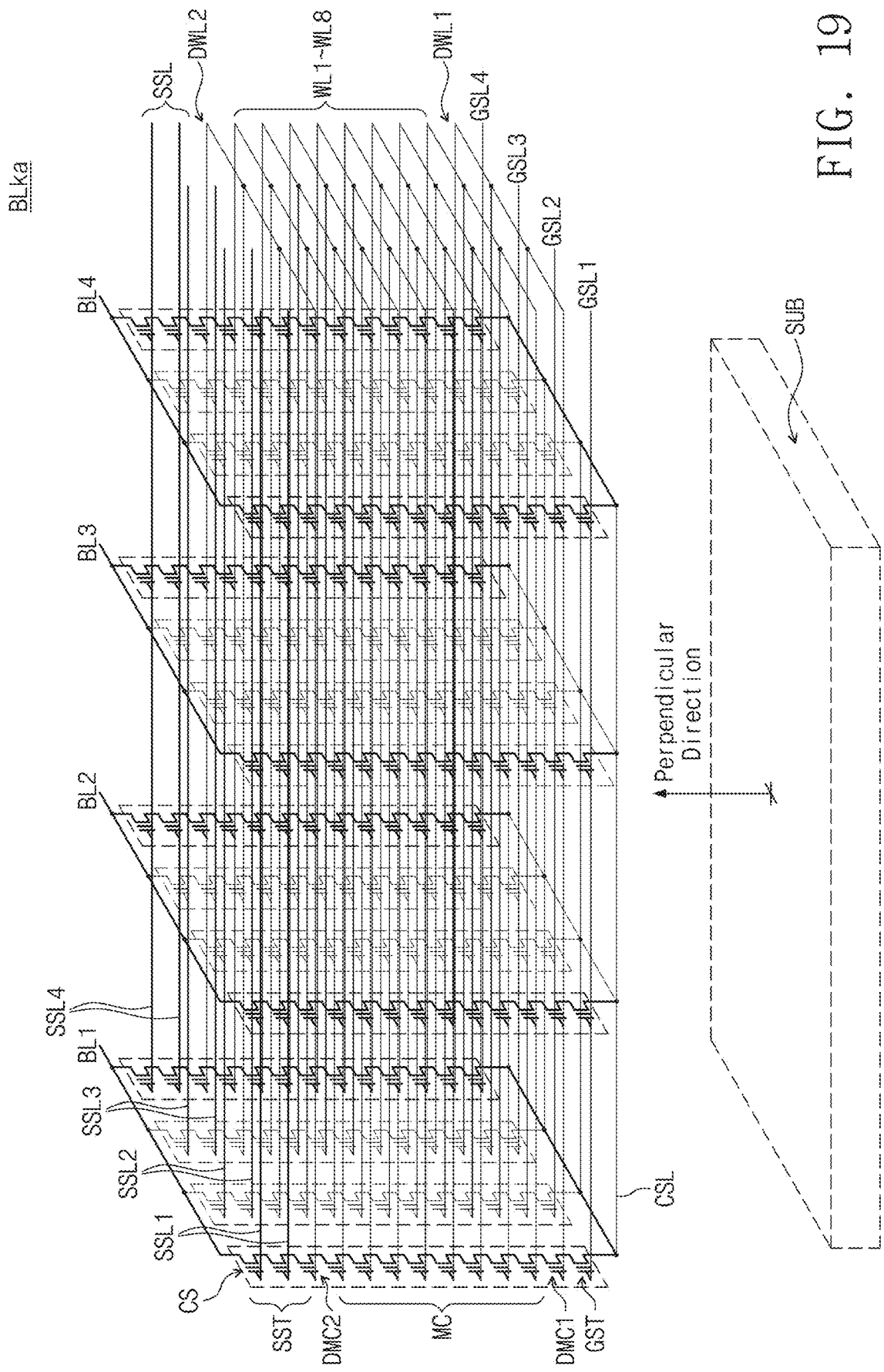
FIG. 19 illustrates an example of a memory block according to at least one example embodiment of the inventive concepts.

FIG. 19 illustrates an example of a memory block BLKa according to at least one example embodiment of the inventive concepts. Referring to FIG. 3, a plurality of cell strings CS may be arranged on a substrate SUB in rows and columns. The cell strings CS may be connected in common to a common source line CSL that is formed on (or in) the substrate SUB. In FIG. 19, a location of the substrate SUB is exemplified to help understand a structure of the memory block BLKa.

An embodiment is exemplified in FIG. 19 as the common source line CSL is connected to lower ends of the cell strings CS. However, it is sufficient that the common source line CSL is electrically connected to the lower ends of the cell strings CS. However, At least some example embodiments of the inventive concepts may not be limited to the case that the common source line CSL is physically located at the lower ends of the cell strings CS. An embodiment is exemplified in FIG. 19 as the cell strings CS are arranged in a four-by-four matrix. However, the number of cell strings CS in the memory block BLKa may increase or decrease.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be blurred.

Each cell string CS may include at least one ground selection transistor GST connected to the corresponding ground selection line, a plurality of memory cells MC respectively connected to a plurality of word lines WL1 to WL8, and string selection transistors SST connected to the corresponding string selection line. In each cell string CS, the ground selection transistor GST, the memory cells MC, and the string selection transistor SST may be serially connected to each other along a direction perpendicular to the substrate SUB and may be sequentially stacked along the direction perpendicular to the substrate SUB.

In an embodiment, in each cell string CS, one or more dummy memory cells may be arranged between the ground selection transistor GST and the memory cells MC. In each cell string CS, one or more dummy memory cells may be arranged between the string selection transistors SST and the memory cells MC. In each cell string CS, one or more dummy memory cells may be arranged between the memory cells MC.

The dummy memory cells may have the same structure as the memory cells MC and may not be programmed (e.g., program inhibited) or may be programmed differently from the memory cells MC. For example, when memory cells MC are programmed to form two or more threshold voltage distributions, the dummy memory cells may be programmed to have one threshold voltage distribution range.

Memory cells of the cell strings CS that are located at the same height (or order) from the substrate SUB or the ground selection transistor GST may be electrically connected to each other. Memory cells of the cell strings CS that are arranged at different heights (or orders) from the substrate SUB or the ground selection transistor GST may be electrically separated from each other.

An embodiment is established in FIG. 19 as memory cells of the same height are connected to the same word line. However, the memory cells of the same height may be directly connected to each other in a plane where the memory cells are formed or may be indirectly connected to each other through another layer such as a metal layer.

The memory block BLKa may be provided at a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

According to at least one example embodiment of the inventive concepts, the 3D memory array includes vertical NAND strings (or cell strings) that are vertically oriented such that at least one memory cell is located over another memory cell. The at least one memory cell may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Memory cells connected to one string selection line and one word line may constitute one physical page. Memory cells connected to different string selection lines or different word lines may belong to different physical pages. As illustrated in FIG. 19, one memory block may include physical pages that are sequentially disposed along a height direction perpendicular to a substrate and a direction in which bit lines extend.

As described with reference to FIG. 18, write data may be written in different memory cells, different logical pages, different physical pages, or different memory blocks depending on the sub-commands SC1 to SC3 (refer to FIG. 9). That is, sub-data elements corresponding to the sub-commands SC1 to SC3 may be written in different storage regions belonging to different address ranges.

According to at least one example embodiment of the inventive concepts, a write command is divided into sub-commands, and a sub command and at least one read command are processed in turn. Accordingly, there are provided a storage device including a nonvolatile memory device and a controller, the controller, and an operating method of the storage device, which are capable of preventing processing of subsequent commands from being delayed due to a write command and improving a speed.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A controller comprising:
a host interface configured to communicate with an external host device;
a memory interface including a direct memory access (DMA) configured to convey a command, an address, and data to a nonvolatile memory through an input/output channel;
a memory including a command queue and storing computer-executable instructions;
an error correction block configured to perform error correction encoding based on the data being written in the nonvolatile memory, and perform error correction decoding on the data being received from the nonvolatile memory; and
processing circuitry including a first processor configured for communication with the host interface and a second processor configured for communication with the nonvolatile memory, the processing circuitry being configured to execute the computer-executable instructions so as to:
communicate with the external host device through the host interface,
communicate with the nonvolatile memory through the memory interface,
communicate with a random access memory through a buffer control circuit,
enqueue first write commands and first read commands received from the external host device in the command queue,
slice at least one write command of the first write commands to generate a plurality of sub-commands, and fetch a command from the command queue and alternately transmit at least one read command of the first read commands, and one sub-command of the plurality of sub-commands to the nonvolatile memory through the DMA, the alternately transmitting the at least one read command and the one sub-command including performing the alternating when the respective queues are not empty.

2. The controller of claim 1, wherein
the memory further includes a sub-queue; and
the processing circuitry is further configured to enqueue the plurality of sub-commands in the sub-queue.

3. The controller of claim 2, wherein the processing circuitry is further configured to alternately select the command queue and the sub-queue to alternately fetch the at least one read command from the command queue and fetch the one sub-command from the sub-queue.

4. The controller of claim 1, wherein, in response to a size of one write command of the first write commands being smaller than a size threshold, the processing circuitry is further configured to prevent slicing of the one write command.

5. The controller of claim 4, wherein the processing circuitry is further configured to fetch the one write command from the command queue to transmit the one write command to the nonvolatile memory through the DMA.

6. The controller of claim 4, wherein the processing circuitry is further configured to adjust the size threshold based on a number of free entities of a sub-queue included in the memory.

7. The controller of claim 4, wherein the processing circuitry is further configured to adjust the size threshold based on a number of the first write commands.

8. The controller of claim 1, wherein, in response to a number of free entities of a sub-queue included in the memory being under a lower threshold, the processing circuitry is further configured to prevent slicing one write command of the first write commands.

9. The controller of claim 1, wherein, in response to a number of the first write commands being over an upper threshold, the processing circuitry is further configured to prevent slicing of the at least one write command.

10. The controller of claim 1, wherein the processing circuitry is further configured to adjust a number of the at least one read command based on at least one of:
a size of write data, a number of the first write commands or busy ratio of the controller, a ratio of write resources under using, a ratio of the first read commands to the first write commands, or any combinations thereof.

11. The controller of claim 1, wherein
the command queue includes a read command queue and a write command queue; and
the processing circuitry is further configured to,
enqueue the first read commands in the read command queue, and
enqueue the plurality of sub-command in the write command queue.

12. The controller of claim 11, wherein, the processing circuitry is further configured to slice the at least one write command in response to the at least one write command being received from the external host device.

13. The controller of claim 11, wherein in response to one write command of the first write commands being received and a size of the one write command being smaller than a size threshold, the processing circuitry is further configured to enqueue the one write command in the write command queue without slicing.

14. The controller of claim 11, wherein the processing circuitry is further configured to alternately select the read command queue and the write command queue to alternately fetch the at least one read command and the one sub-command.

15. A storage device comprising:
a nonvolatile memory including a plurality of nonvolatile memory cells; and
a controller comprising:
a host interface configured to communicate with an external host device;
a memory interface including a direct memory access (DMA) configured to convey a command, an address, and data to the nonvolatile memory through an input/output channel;
a memory including a command queue and storing computer-executable instructions;
an error correction block configured to perform error correction encoding based on the data being written in the nonvolatile memory, and perform error correction decoding on the data being received from the nonvolatile memory; and
processing circuitry including a first processor configured for communication with the host and a second processor configured for communication with the nonvolatile memory, the processing circuitry being configured to execute the computer-executable instructions so as to:
communicate with an external host device through the host interface,
communicate with the nonvolatile memory through the memory interface,
communicate with a random access memory through a buffer control circuit,
enqueue first write commands and first read commands received from the external host device in the command queue,
slice at least one write command of the first write commands to generate a plurality of sub-commands, and
fetch a command from the command queue and alternately transmit at least one read command of the first read commands, and one sub-command of the plurality of sub-commands to the nonvolatile memory through the DMA, the alternately transmitting the at least one read command and the one sub-command including performing the alternating when the respective queues are not empty.

16. The storage device of claim 15, wherein
the memory further includes a sub-queue; and
the processing circuitry is further configured to enqueue the plurality of sub-commands in the sub-queue.

17. The storage device of claim 16, wherein the processing circuitry is further configured to alternately select the command queue and the sub-queue to alternately fetch the at least one read command from the command queue and fetch the one sub-command from the sub-queue.

18. The storage device of claim 15, wherein
the command queue includes a read command queue and a write command queue; and
the processing circuitry is further configured to,
enqueue the first read commands in the read command queue, and
enqueue the plurality of sub-command in the write command queue.

19. The controller of claim 18, wherein in response to one write command of the first write commands being received and a size of the one write command being smaller than a size threshold, the processing circuitry is further configured to enqueue the one write command in the write command queue without slicing.

20. The storage device of claim 18, wherein the processing circuitry is further configured to alternately select the read command queue and the write command queue to alternately fetch the at least one read command and the one sub-command.

21. A controller comprising:
a host interface configured to communicate with an external host device;
a memory interface including a direct memory access (DMA) configured to convey a command, an address, and data to a nonvolatile memory through an input/output channel;
a memory including a command queue and storing computer-executable instructions;
an error correction block configured to perform error correction encoding based on the data being written in the nonvolatile memory, and perform error correction decoding on the data being received from the nonvolatile memory; and
processing circuitry including a first processor configured for communication with the host interface and a second processor configured for communication with the nonvolatile memory, the processing circuitry configured to execute the computer-executable instructions so as to:
communicate with the external host device through the host interface,
communicate with the nonvolatile memory through the memory interface,
communicate with a random access memory through a buffer control circuit,
enqueue first write commands and first read commands received from the external host device in the command queue,
slice at least one write command of the first write commands to generate a plurality of sub-commands, the slicing set to an integer multiple of one of a translation unit of a translation layer, a write unit of the nonvolatile memory, or an access unit of the DMA, and
fetch a command from the command queue and alternately transmit at least one read command of the first read commands, and one sub-command of the plurality of sub-commands to the nonvolatile memory through the DMA.

* * * * *